(12) United States Patent
Yamaki

(10) Patent No.: US 8,385,134 B2
(45) Date of Patent: Feb. 26, 2013

(54) SEMICONDUCTOR INTEGRATED CIRCUIT DEVICE

(75) Inventor: Takashi Yamaki, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/244,448

(22) Filed: Sep. 24, 2011

(65) Prior Publication Data
US 2012/0081975 A1 Apr. 5, 2012

(30) Foreign Application Priority Data

Sep. 30, 2010 (JP) ................................. 2010-220471
Feb. 18, 2011 (JP) ................................... 2011-33333

(51) Int. Cl.
*G11C 7/06* (2006.01)
(52) U.S. Cl. ............................. 365/189.07; 365/185.21
(58) Field of Classification Search .................. 365/154, 365/156, 189.07, 189.09, 226
See application file for complete search history.

(56) References Cited

U.S. PATENT DOCUMENTS

| | | | | |
|---|---|---|---|---|
| 7,245,521 B2 * | 7/2007 | Mori et al. | ..................... | 365/156 |
| 7,420,857 B2 * | 9/2008 | Hirota et al. | ............. | 365/189.09 |
| 7,486,544 B2 * | 2/2009 | Mori et al. | ..................... | 365/156 |
| 7,596,013 B2 * | 9/2009 | Yamaoka et al. | ............. | 365/154 |
| 7,706,173 B2 * | 4/2010 | Ikeda | ............................ | 365/154 |
| 8,085,579 B2 * | 12/2011 | Inoue | ............................ | 365/154 |
| 8,107,279 B2 * | 1/2012 | Yamaoka et al. | ............. | 365/154 |
| 8,134,874 B2 * | 3/2012 | Shiu et al. | ................ | 365/189.06 |
| 2006/0023520 A1 | 2/2006 | Mori et al. | | |
| 2007/0097756 A1 | 5/2007 | Hirota et al. | | |
| 2008/0013368 A1 | 1/2008 | Mori et al. | | |
| 2008/0170459 A1 | 7/2008 | Ikeda | | |

FOREIGN PATENT DOCUMENTS

| | | |
|---|---|---|
| JP | 2006-040495 A | 2/2006 |
| JP | 2007-122814 A | 5/2007 |
| JP | 2008-176829 A | 7/2008 |

* cited by examiner

*Primary Examiner* — Gene Auduong
(74) *Attorney, Agent, or Firm* — Miles and Stockbridge P.C.

(57) ABSTRACT

When a leakage type determining circuit determines that leakage current components of a gate leakage and a substrate leakage are larger in a resume standby mode, a VDDR regulator generates a power supply voltage VDDR at a first voltage level lower than a power supply voltage VDD, and supplies the voltage as a power supply voltage VDDR1 to an SRAM module via a selector switch. When the leakage type determining circuit determines that a leakage current of a channel leakage is larger, the VDDR regulator supplies the power supply voltage VDDR1 higher than the first voltage level and lower than the power supply voltage VDD to the SRAM module. Also, an ARVSS regulator supplies a cell source power supply voltage higher than a reference voltage to an SRAM module in another region.

18 Claims, 28 Drawing Sheets

FIG. 16

|  | ROOM TEMPERATURE | HIGH TEMPERATURE |
|---|---|---|
| GATE LEAKAGE | 0.3 | 0.3 |
| CHANNEL LEAKAGE | 1 | 100 |
| SUBSTRATE LEAKAGE | 1.5 | 5 |

CHANNEL LEAKAGE : WHEN ROOM TEMPERATURE IS TAKEN AS 1

FIG. 17

|  | ROOM TEMPERATURE | HIGH TEMPERATURE |
|---|---|---|
| PRESENT TECHNIQUE | 1 | 15 |
| VDD CONTROL | 1 | 30 |
| ARVSS CONTROL | 1.5 | 15 |

VDD CONTROL : WHEN ROOM TEMPERATURE IS TAKEN AS 1

SEMICONDUCTOR INTEGRATED CIRCUIT DEVICE

CROSS-REFERENCE TO RELATED APPLICATION

The present application claims priority from Japanese Patent Application No. 2010-220471 filed on Sep. 30, 2010 and Japanese Patent Application No. 2011-33333 filed on Feb. 18, 2011, the contents of which are hereby incorporated by reference into this application.

TECHNICAL FIELD OF THE INVENTION

The present invention relates to a technology for reducing current consumption in a semiconductor integrated circuit device, and in particular relates to a technology effective in reducing a leakage current in a semiconductor integrated circuit device having an SRAM (Static Random Access Memory).

BACKGROUND OF THE INVENTION

In recent years, microfabrication of semiconductor elements in semiconductor integrated circuit devices has been advanced. With the advance of the microfabrication, a leakage current of a device tends to be increased. Also, despite the increase in the memory capacity, a semiconductor memory such as an SRAM provided in a semiconductor integrated circuit device for use in a mobile product such as a cellular phone is required to have a predetermined value in specifications of a leakage current in a standby state (in a memory data retaining state) or the like.

In an example of a known technology for reducing a leakage current in a standby state in an SRAM provided in a semiconductor integrated circuit device, a channel leakage of a memory cell is reduced by controlling a source potential (ARVSS) of the memory cell in an SRAM in a standby state.

Examples of the leakage current reducing technology in this type of semiconductor memory include: a technology in which, in a standby state, a predetermined voltage which is lower than a power supply voltage and with which a PN junction between an N-type well and a source of a P-channel MOSFET is not forward-biased is supplied to the N-type well in which the P-channel MOSFET of a memory cell is formed and a predetermined voltage which is higher than a ground potential and with which a PN junction between a P-type well and a source of an N-channel MOSFET is not forward-biased is supplied to the P-type well in which the N-channel MOSFET is formed (see Japanese Unexamined Patent Application Publication No. 2006-40495 (Patent Document 1)); a technology in which a source potential of a drive MOS transistor is set to be higher than a ground potential in a standby state (see Japanese Unexamined Patent Application Publication No. 2007-122814 (Patent Document 2)); and a technology in which a power supply voltage between a power supply potential and a reference potential is supplied between power supply terminals of each CMOS inverter constituting a memory cell when a word line is ON and a retainable voltage which is lower than the power supply voltage and equal to or higher than a lower-limit voltage with which data can be retained is supplied between the power supply terminals of each CMOS inverter constituting a memory cell when a word line is OFF (see Japanese Unexamined Patent Application Publication No. 2008-176829 (Patent Document 3)).

SUMMARY OF THE INVENTION

However, the inventor of the present invention has found the following problems in the technologies for reducing the leakage current in semiconductor memories described above.

With the microfabrication of semiconductor elements such as transistors, leakage current components have been more and more diversified, and gate leakage or substrate leakage sometimes becomes larger than channel leakage under certain conditions (for example, at low temperature).

For this reason, the different leakage current reducing technologies have to be accordingly used for different leakage current components, and there is a problem that the technology which suppresses only the channel leakage cannot optimally reduce the leakage current in accordance with the leakage current components.

An object of the present invention is to provide a technology capable of performing optimal voltage control in accordance with leakage current components of memory cells and significantly reducing a leakage current.

The above and other objects and novel characteristics of the present invention will be apparent from the description of the present specification and the accompanying drawings.

The following is a brief description of an outline of the typical invention disclosed in the present application.

The present invention is directed to a semiconductor integrated circuit device including a static memory with a normal operation state and a standby state of retaining data of a memory cell, the static memory has a plurality of memory cells arranged in a matrix, the memory cells each include an inverter made up of an N-type MOS transistor and a P-type MOS transistor, a cell power supply voltage line for giving a power supply voltage to the P-type MOS transistor and a cell source voltage line for giving a source voltage to the N-type MOS transistor are provided, the static memory in the standby state is able to be set in any of a first state and a second state, the cell power supply voltage line in both of the first state and the second state has a voltage lower than a voltage in the normal operation state, and the cell power supply voltage line and the cell source voltage line in the first state have voltages lower than voltages thereof in the second state.

Also, the present invention is directed to a semiconductor integrated circuit device including a static memory with a normal operation state and a standby state of retaining data of a memory cell, the static memory has a plurality of memory cells arranged in a matrix, the memory cells each include an inverter made up of an N-type MOS transistor and a P-type MOS transistor, a cell power supply voltage line for giving a power supply voltage to the P-type MOS transistor, a cell source voltage line for giving a source voltage to the N-type MOS transistor, and a back gate voltage line for giving a back gate voltage to a back gate of the N-type MOS transistor are provided, the static memory in the standby state is able to be set in any of a third state and a fourth state, in the third state, the cell source voltage line and the back gate voltage line have voltages equal to each other and higher than a ground voltage, and in the fourth state, the back gate voltage line has a voltage equal to or higher than the ground voltage and lower than a voltage of the cell source voltage line.

Furthermore, other general outlines of the present invention are briefly described below.

In the present invention, a channel leakage current of the N-type MOS transistor is lower in the second state than in the first state.

Also, in the present invention, a channel leakage current of the N-type MOS transistor is lower in the third state than in the fourth state.

Still further, in the present invention, the memory cells each include: a leakage type determining unit which determines which one of a current component indicating a sum of a gate leakage and a substrate leakage and a current component indicating a channel leakage is larger and outputs a determination result thereof as a leakage determining signal; and a voltage control unit which variably controls a voltage to be supplied to the memory cell based on the leakage determining signal.

Still further, in the present invention, the leakage type determining unit includes: a first leakage measurement transistor which measures leakage currents of the gate leakage and the substrate leakage; a second leakage measurement transistor which measures a leakage current of the channel leakage; and a determining unit which compares the leakage currents measured by the first leakage measurement transistor and the second leakage measurement transistor, determines which one is larger between the leakage current of the gate leakage and the substrate leakage and the leakage current of the channel leakage, and outputs the determination result thereof as the leakage determining signal.

Still further, in the present invention, the leakage type determining unit switches the leakage determining signal depending on temperature.

Still further, in the present invention, the leakage type determining unit includes a temperature sensor unit and a determining unit, and it is determined that the leakage current of the channel leakage is larger when a temperature measured by the temperature sensor unit is higher than a threshold temperature, it is determined that the leakage current of the gate leakage and the substrate leakage is larger when the temperature measured by the temperature sensor unit is lower than the threshold temperature, and the determination result is outputted as the leakage determining signal.

Still further, in the present invention, state selection is made from outside of the static memory.

Still further, in the present invention, a logic circuit formed of a central processing unit or a logic circuit capable of achieving an arbitrary function is provided.

Still further, in the present invention, a register which retains a signal given from outside of the semiconductor integrated circuit device is provided, the register is set at the first state or the second state by the signal.

Still further, in the present invention, a register which retains a signal given from outside of the semiconductor integrated circuit device is provided, and the register is set at the third state or the fourth state by the signal.

The effects obtained by typical embodiments of the invention disclosed in the present application will be briefly described below.

(1) In the standby state of the SRAM, optimal voltage control can be performed in accordance with the leakage current components, and therefore, the leakage current can be efficiently reduced.

(2) From (1) above, power consumption in the semiconductor integrated circuit device can be reduced.

BRIEF DESCRIPTIONS OF THE DRAWINGS

FIG. 16 is a table for describing a ratio of each of the leakage current components in a transistor;

FIG. 17 is a table for describing an example of a leakage reduction effect of the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiments, and the repetitive description thereof will be omitted.

First Embodiment

Figure 1:
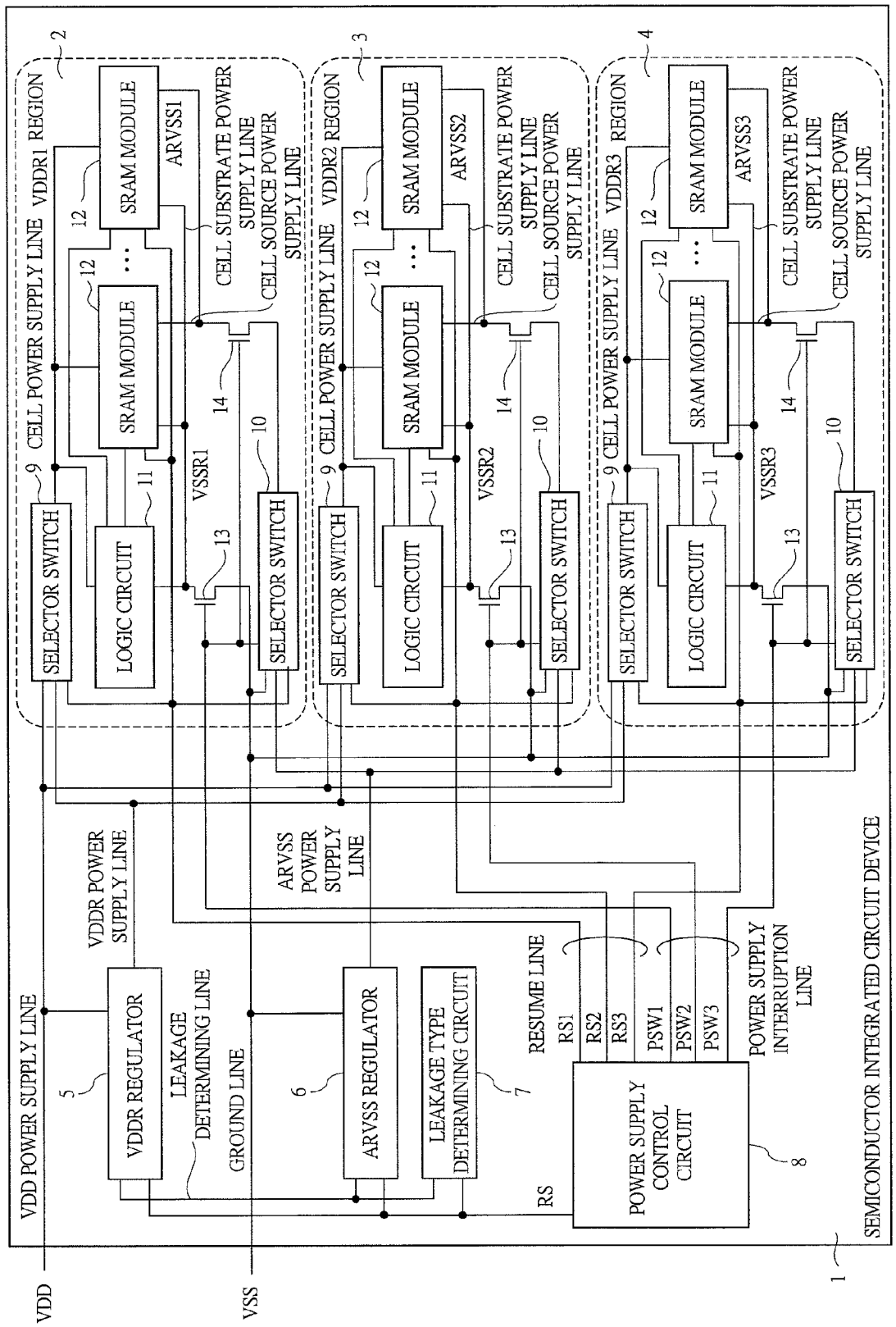
FIG. 1 is a block diagram of an example of a semiconductor integrated circuit device according to a first embodiment of the present invention.
Figure 2:
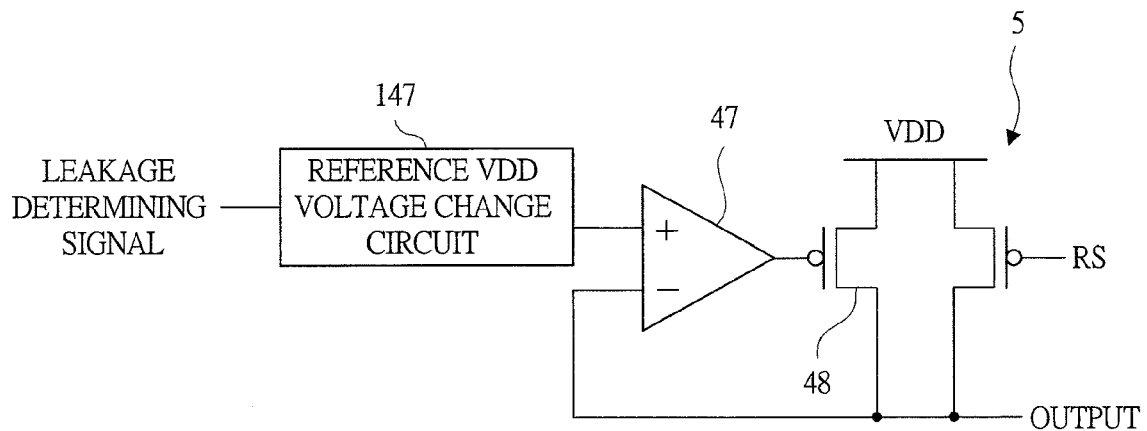
FIG. 2 is a diagram for describing an example of a structure of a VDDR regulator provided in the semiconductor integrated circuit device of FIG. 1.
Figure 3:
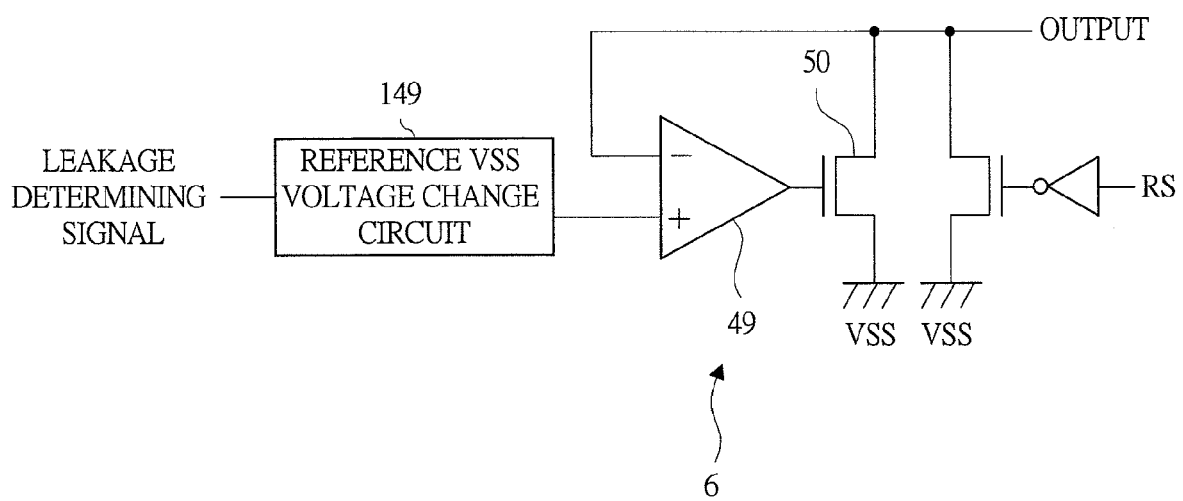
FIG. 3 is a diagram for describing an example of a structure of an ARVSS regulator provided in the semiconductor integrated circuit device of FIG. 1.
Figure 4:
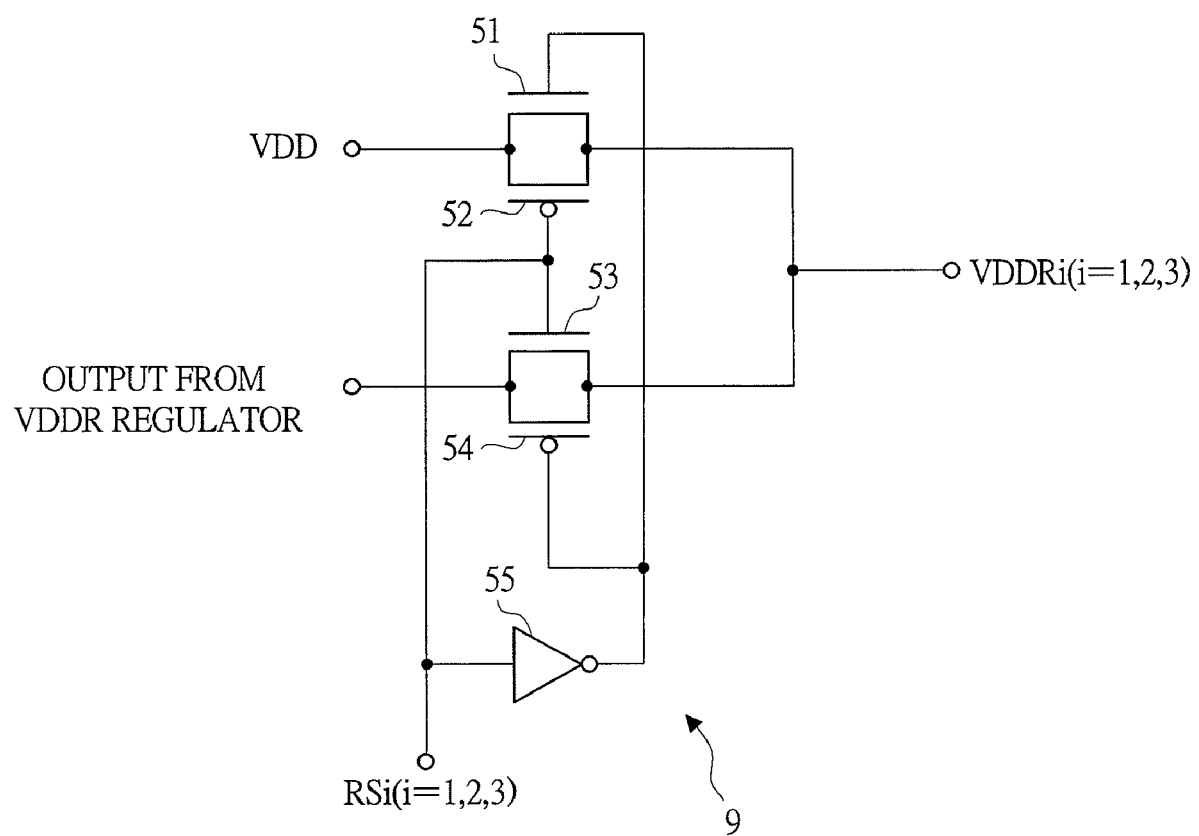
FIG. 4 is a diagram for describing an example of a structure of one selector switch provided in the semiconductor integrated circuit device of FIG. 1.
Figure 5:
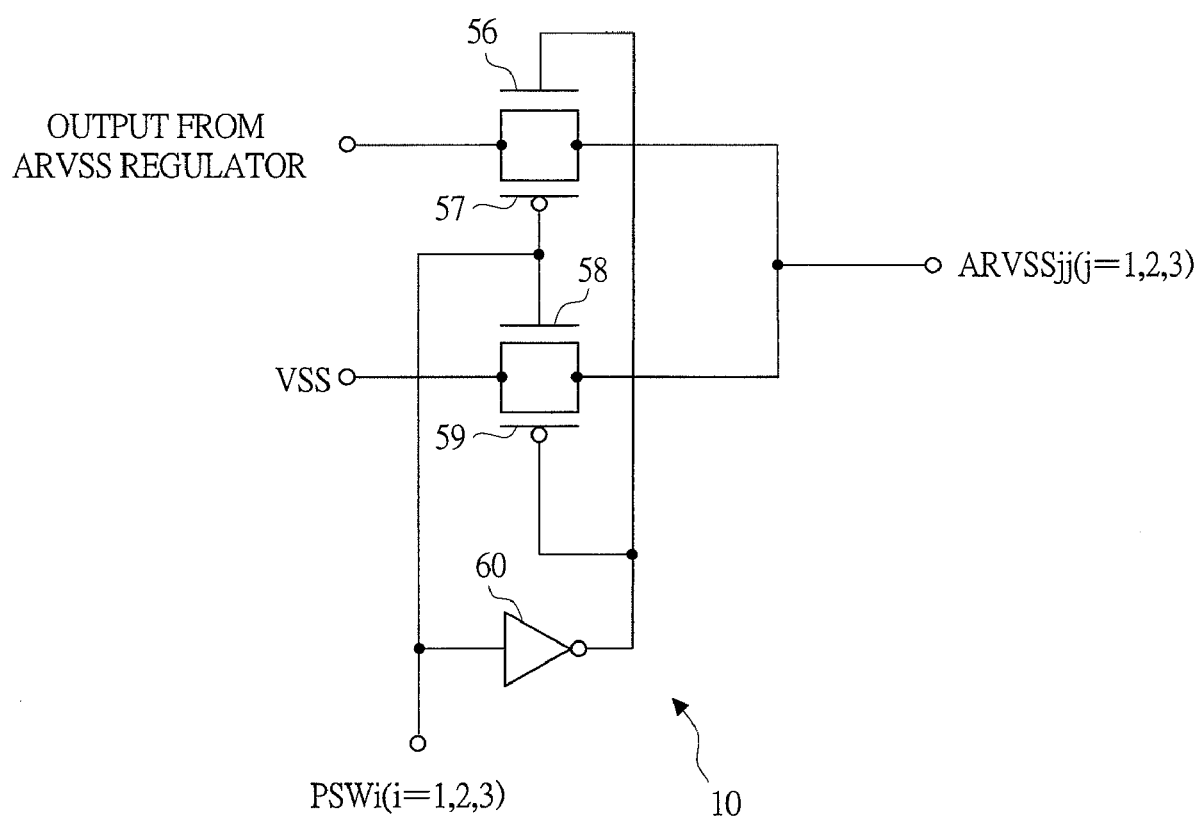
FIG. 5 is a diagram for describing an example of a structure of the other selector switch provided in the semiconductor integrated circuit device of FIG. 1.
Figure 6:
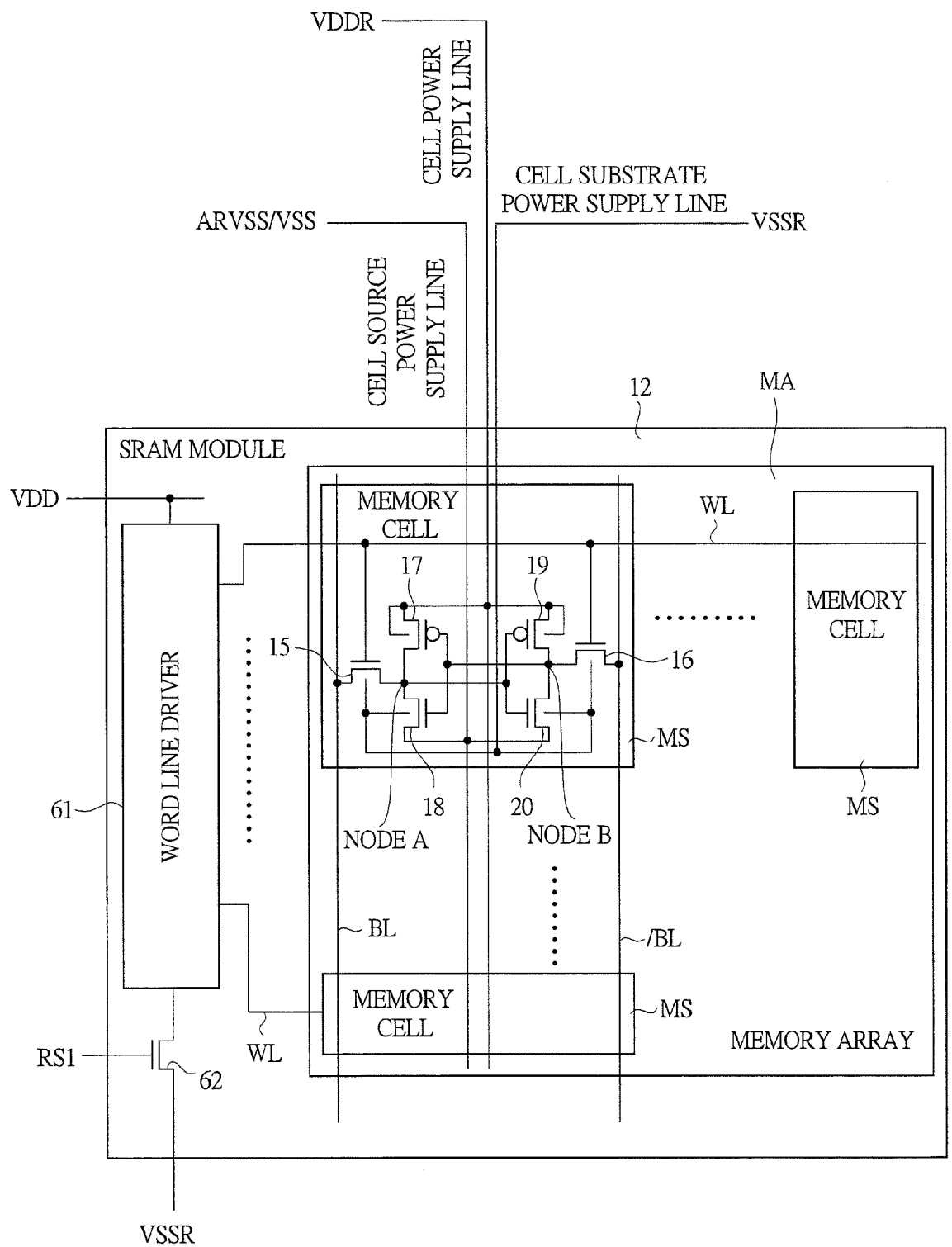
FIG. 6 is a diagram for describing an example of memory cells in an SRAM module provided in the semiconductor integrated circuit device of FIG. 1.
Figure 7:
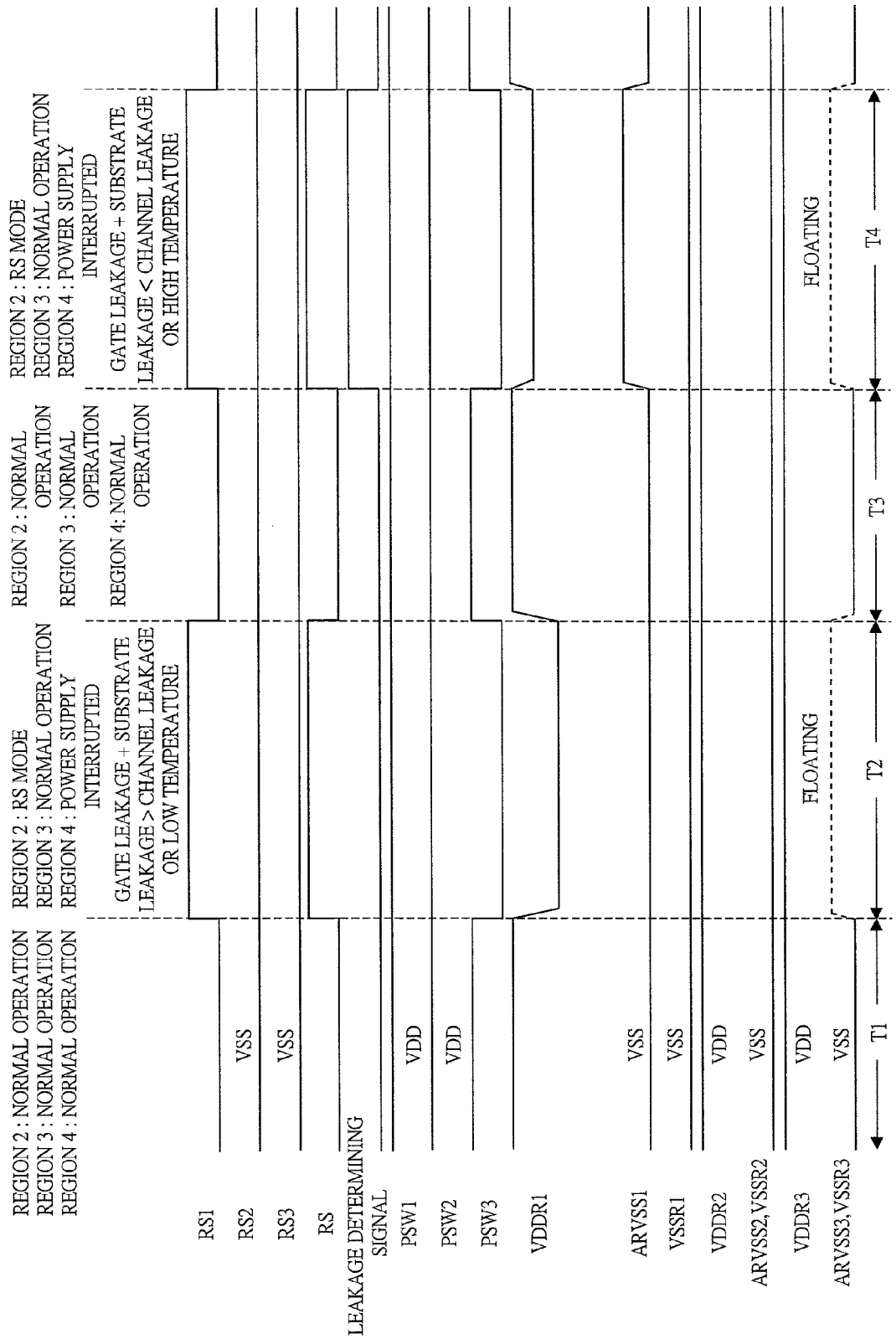
FIG. 7 is a timing chart of an example of operation in the semiconductor integrated circuit device of FIG. 1.
Figure 8:
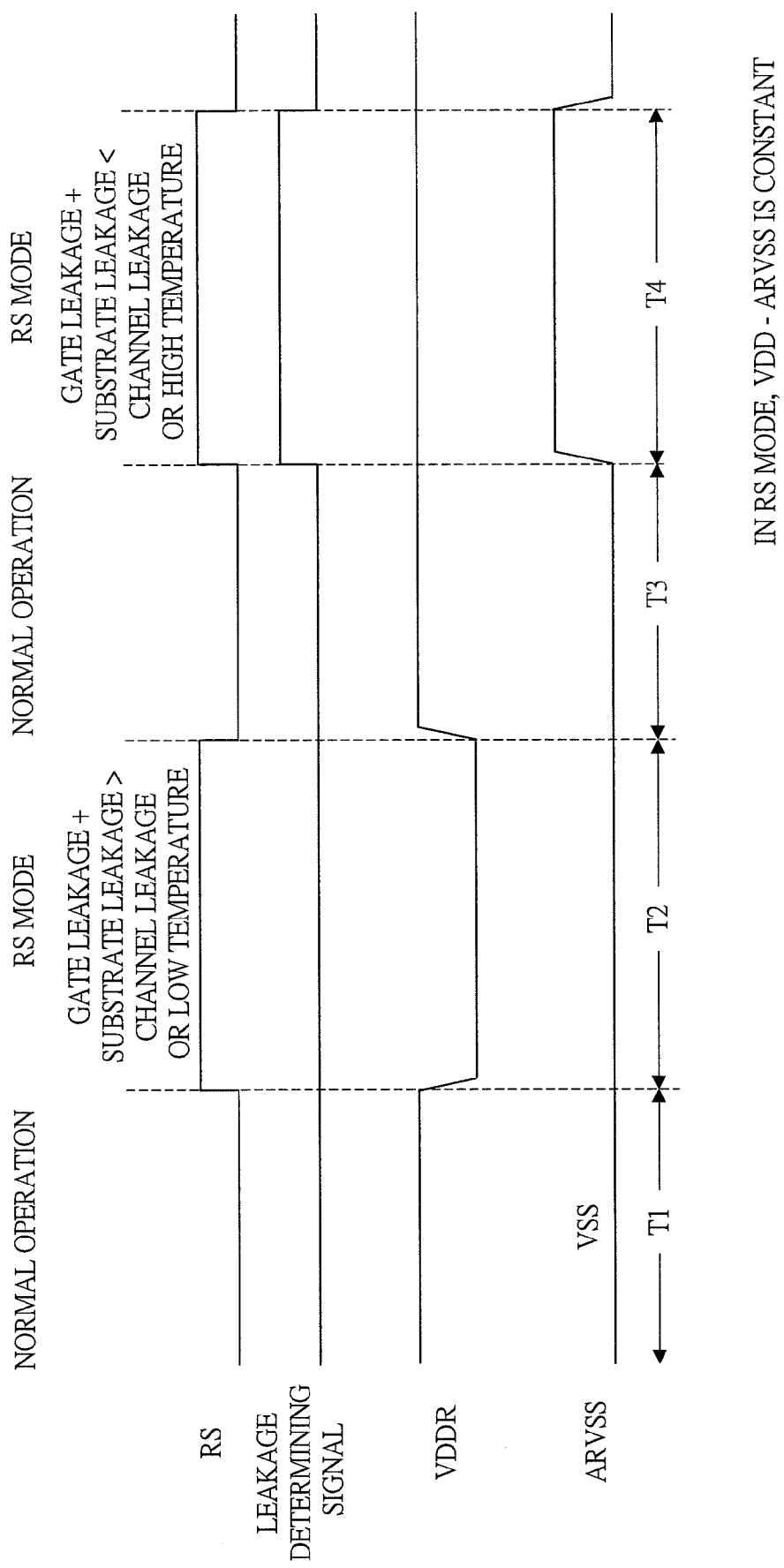
FIG. 8 is a timing chart of another example of FIG. 7.
Figure 9:
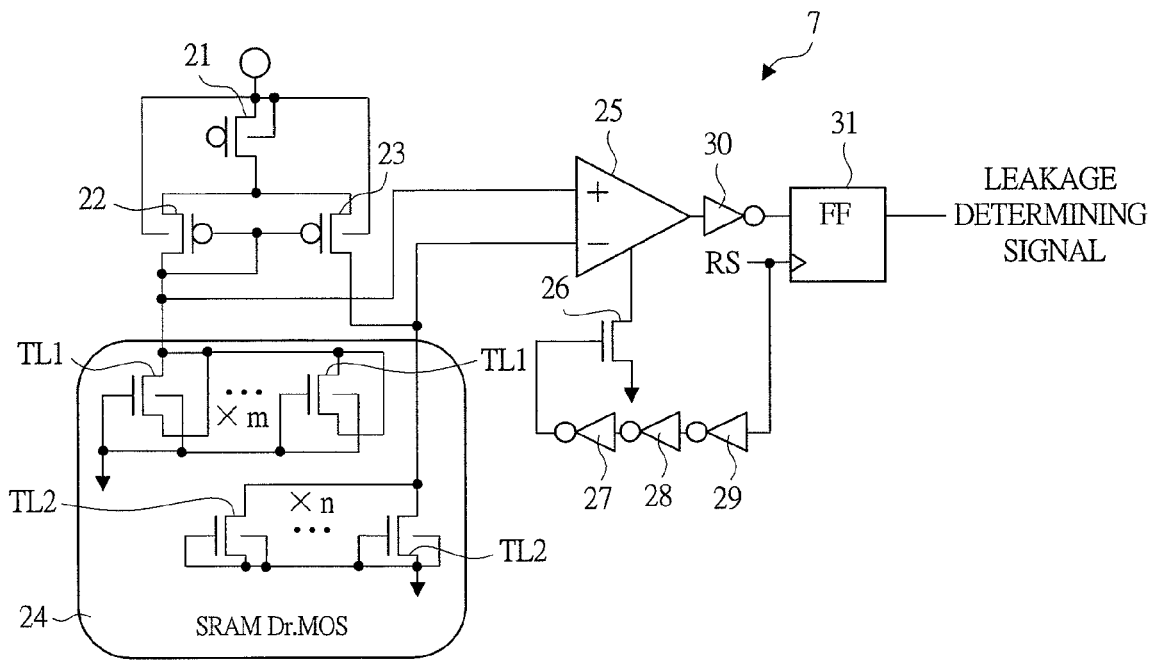
FIG. 9 is a diagram for describing an example of a leakage type determining circuit provided in the semiconductor integrated circuit device of FIG. 1.
Figure 10:
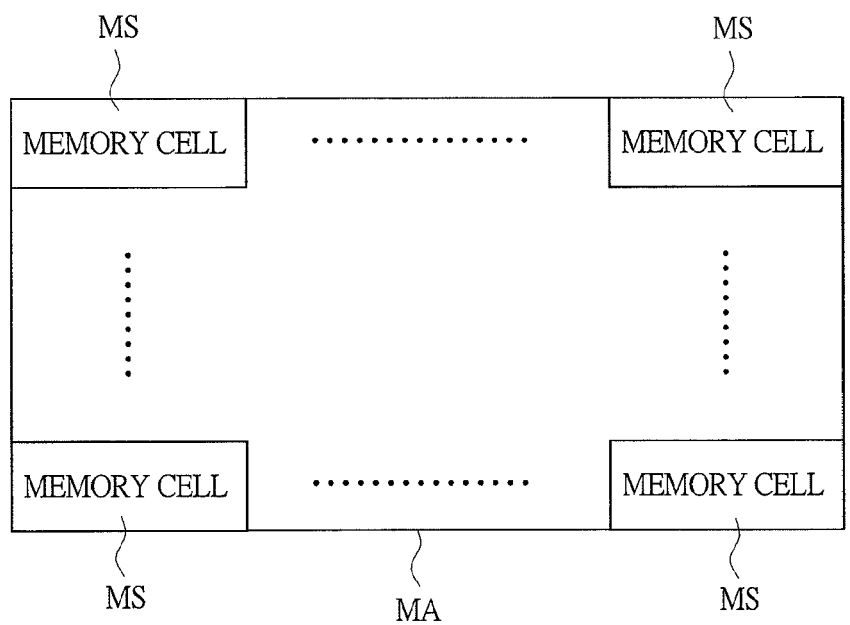
FIG. 10 is a diagram for describing a memory array provided in each region in the semiconductor integrated circuit device of FIG. 1.
Figure 11:
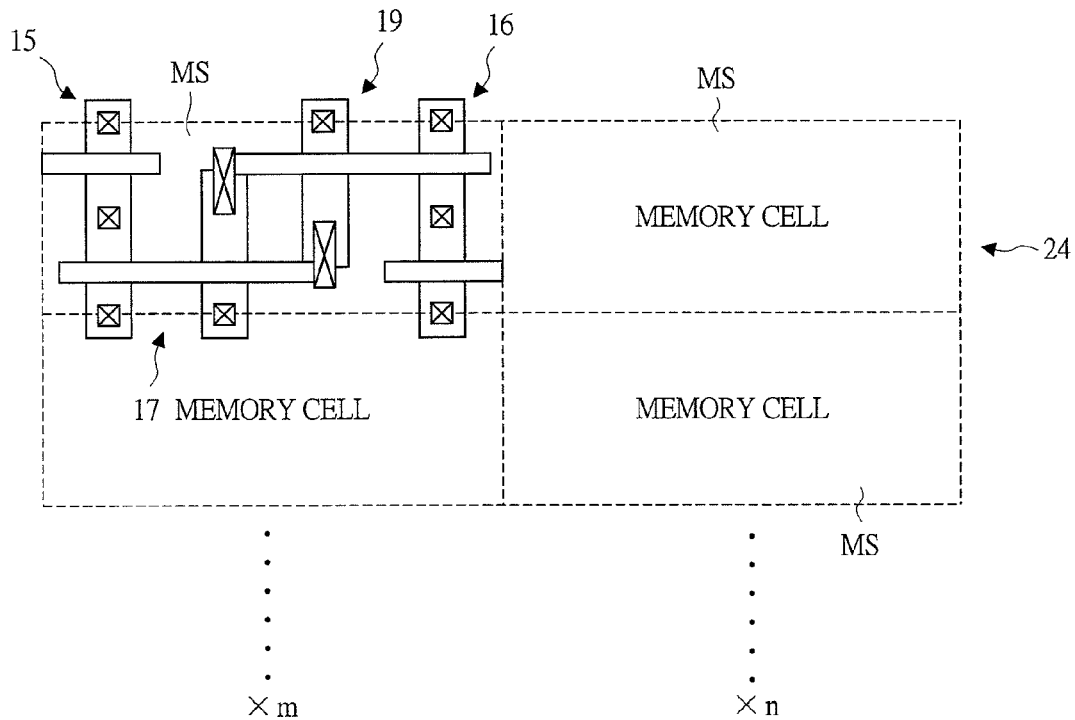
FIG. 11 is a diagram for describing an example of layout of a leakage determining transistor unit in the leakage type determining circuit of FIG. 9.
Figure 12:
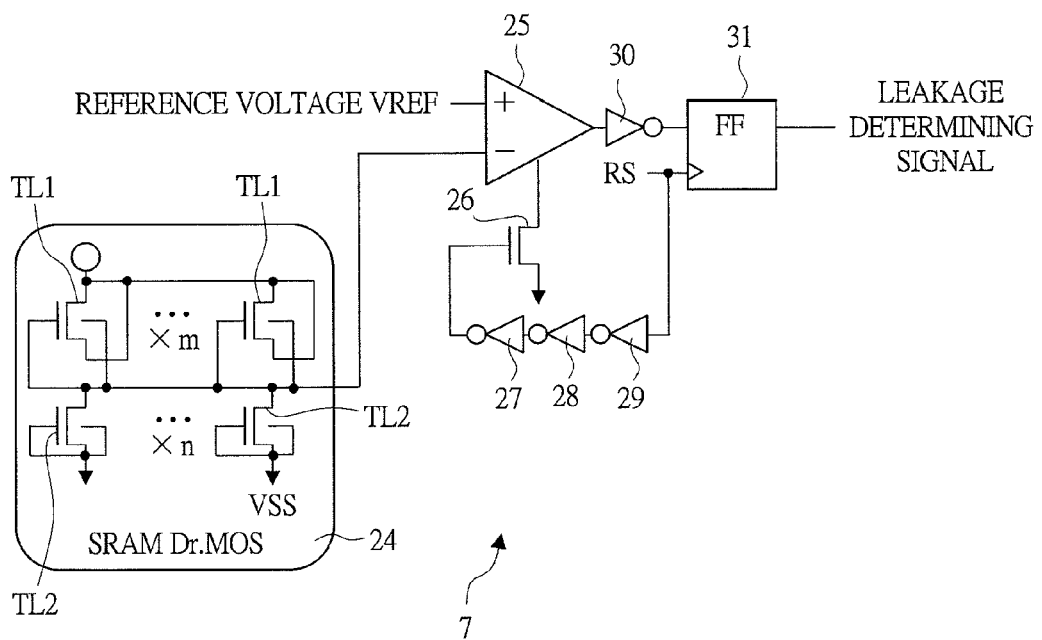
FIG. 12 is a diagram for describing an example of a structure of the leakage type determining circuit of FIG. 9.
Figure 13:
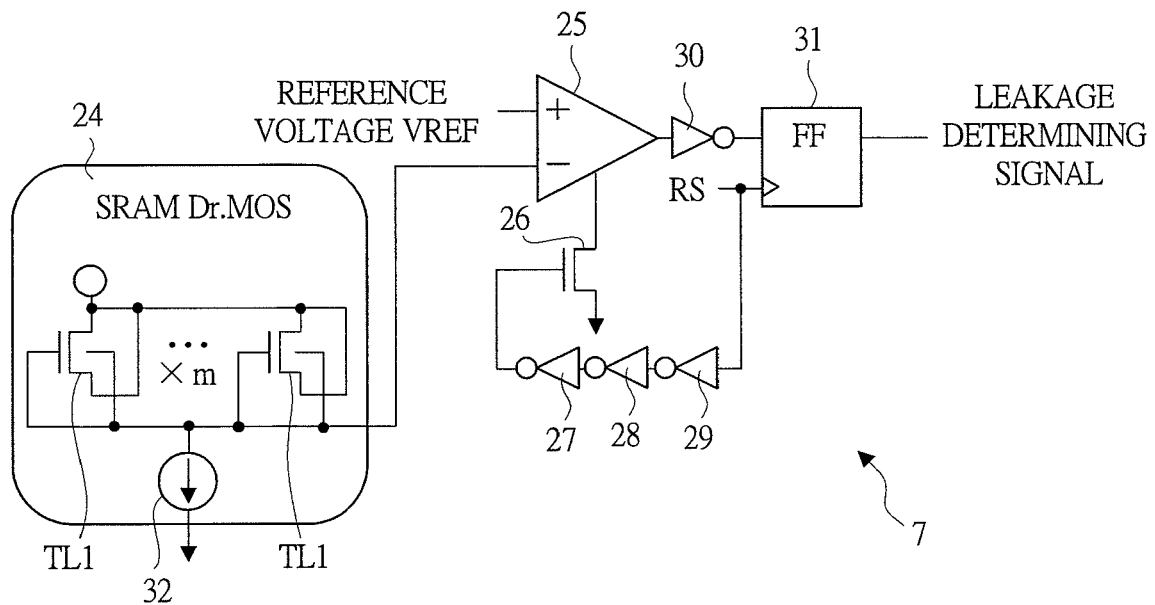
FIG. 13 is a diagram for describing another example of a structure of the leakage type determining circuit of FIG. 9.
Figure 14:
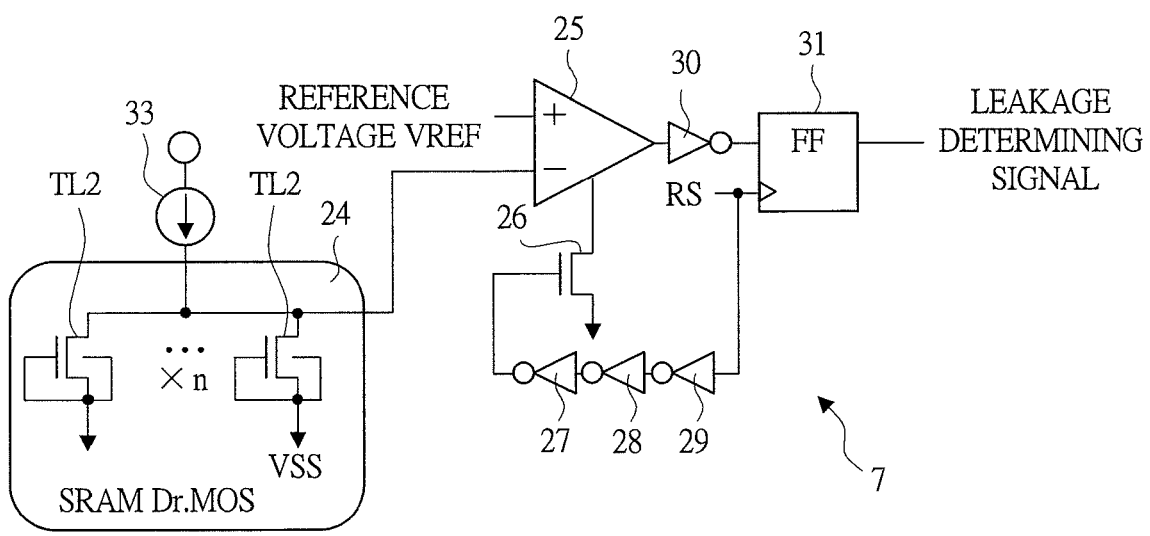
FIG. 14 is a diagram for describing still another example of a structure of the leakage type determining circuit of FIG. 9.
Figure 15:
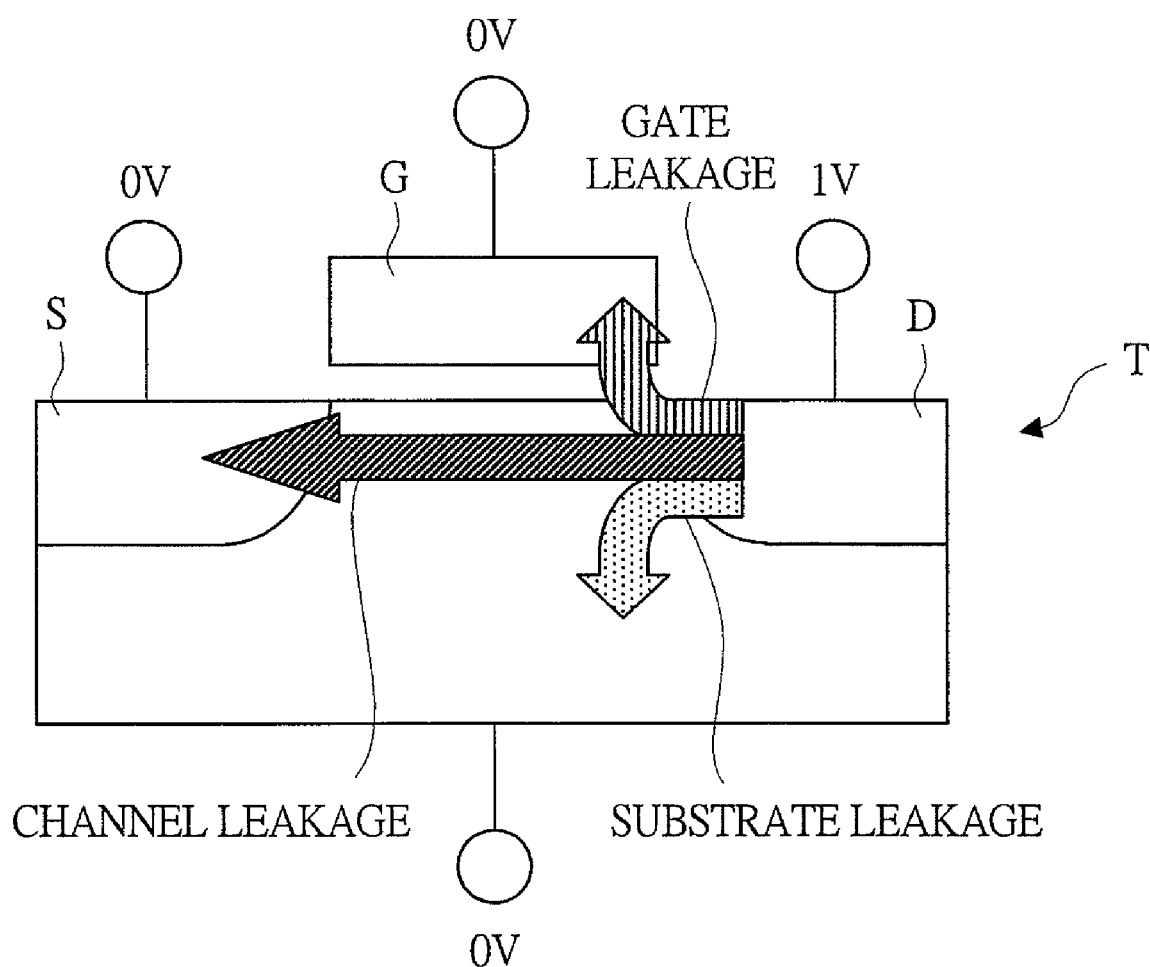
FIG. 15 is a diagram for describing leakage current components in an N-channel MOS transistor.

FIG. 1 is a block diagram of an example of a semiconductor integrated circuit device according to a first embodiment of the present invention. FIG. 2 is a diagram for describing an example of a structure of a VDDR regulator provided in the semiconductor integrated circuit device of FIG. 1. FIG. 3 is a diagram for describing an example of a structure of an ARVSS regulator provided in the semiconductor integrated circuit device of FIG. 1. FIG. 4 is a diagram for describing an example of a structure of one selector switch provided in the semiconductor integrated circuit device of FIG. 1. FIG. 5 is a diagram for describing an example of a structure of the other selector switch provided in the semiconductor integrated circuit device of FIG. 1. FIG. 6 is a diagram for describing an example of memory cells in an SRAM module provided in the semiconductor integrated circuit device of FIG. 1. FIG. 7 is a timing chart of an example of operation in the semiconductor integrated circuit device of FIG. 1. FIG. 8 is a timing chart of another example of FIG. 7. FIG. 9 is a diagram for describing an example of a leakage type determining circuit provided in the semiconductor integrated circuit device of FIG. 1. FIG. 10 is a diagram for describing a memory array provided in each region in the semiconductor integrated circuit device of FIG. 1. FIG. 11 is a diagram for describing an example of layout of a leakage determining transistor unit in the leakage type determining circuit of FIG. 9. FIG. 12 is a diagram for describing an example of a structure of the leakage type determining circuit of FIG. 9. FIG. 13 is a diagram for describing another example of a structure of the leakage type determining circuit of FIG. 9. FIG. 14 is a diagram for describing still another example of a structure of the leakage type determining circuit of FIG. 9. FIG. 15 is a diagram for describing leakage current components in an N-channel MOS transistor. FIG. 16 is a table for describing a ratio of each of the leakage current components in a transistor. FIG. 17 is a table for describing an example of a leakage reduction effect of the present invention.

General Outlines of First Embodiment

General outlines of the first embodiment are as follows.

The present embodiment relates to a semiconductor integrated circuit device (semiconductor integrated circuit device 1) including a static memory (memory array MA) with a normal operation state and a standby state of retaining data of a memory cell (memory cell MS).

The device includes a cell power supply voltage line (cell power supply line) for giving a power supply voltage to a P-type MOS transistor of a memory cell and a cell source voltage line (cell source power supply line) for giving a source voltage to an N-type MOS transistor of the memory cell.

In the standby state, the static memory can be set to any of a first state and a second state.

In either state, the cell power supply voltage line has a voltage lower than a voltage in the normal operation state, and the cell power supply voltage line and the cell source voltage line in the first state have voltages lower than voltages in the second state.

The first state is such that, for example, with respect to leakage components of a transistor in a memory cell, a current value indicating a sum of a gate leakage and a substrate leakage is larger than a current value indicating a channel leakage in a resume standby mode.

Also, the second state is such that, for example, with respect to leakage components of a transistor in a memory cell, a current value indicating a sum of a gate leakage and a substrate leakage is smaller than a current value indicating a channel leakage in a resume standby mode.

The present embodiment will be described in detail below based on the general outlines described above.

In the first embodiment, a semiconductor integrated circuit device 1 includes, as shown in FIG. 1, regions 2 to 4, a VDDR regulator 5, an ARVSS regulator 6, a leakage type determining circuit 7, a power supply control circuit 8 and others.

The regions 2 to 4 each include selector switches 9 and 10, a logic circuit 11, a plurality of SRAM modules 12, and switches 13 and 14. The regions here are units each provided with SRAM modules and a logic circuit and connected in common to the selector switch 9 and the selector switch 10.

The SRAM modules 12 each have a plurality of memory cells arranged in a matrix and include a word line driver which selects a word line, a sense amplifier which reads data of the memory cells, a write circuit which writes data in the memory cells and others.

Between the SRAM modules 12, a word line and a bit line are divided. Also, the logic circuit 11 includes a CPU as a central processing unit and a logic circuit achieving an arbitrary function.

The VDDR regulator 5 is connected to a power supply line of an externally-inputted power supply voltage VDD and generates, from the power supply voltage VDD, a power supply voltage VDDR to be supplied to the SRAM modules 12, the logic circuit 11 and others. Here, the power supply voltage VDDR is at a voltage level lower than that of the externally-inputted power supply voltage VDD.

Furthermore, the VDDR regulator 5, the ARVSS regulator 6, the leakage type determining circuit 7, the power supply control circuit 8, the selector switches 9 and 10, and the switches 13 and 14 form a leakage control unit.

The ARVSS regulator 6 is connected to a ground line of an externally-inputted reference voltage VSS and generates, from the power supply voltage VDD, a cell source power supply voltage ARVSS to be supplied to the memory cells in the SRAM modules 12.

The power supply voltage VDD is a voltage higher than the ground voltage, and is about 1.0 V to 1.5 V, for example. The ground line is normally at 0 V.

The VDDR regulator 5 includes, as shown in FIG. 2, a reference VDD voltage change circuit 147, an amplifier 47, and a transistor 48 formed of a P-channel MOS.

To the reference VDD voltage change circuit 147, a leakage determining signal is inputted, and a reference voltage in accordance with the leakage determining signal is outputted from the reference VDD voltage change circuit 147 to a positive (+) side input terminal of the amplifier 47.

To one connection part of the transistor 48, the power supply voltage VDD is coupled, and to a gate of the transistor 48, an output part of the amplifier 47 is connected. Also, to the other connection part of the transistor 48, a negative (−) side input terminal of the amplifier 47 is connected, and this connection part serves as an output part of the VDDR regulator 5. The output is controlled also in accordance with a resume standby signal RS.

The ARVSS regulator 6 includes, as shown in FIG. 3, a reference VSS voltage change circuit 149, an amplifier 49 and a transistor 50 formed of an N-channel MOS.

To the reference VSS voltage change circuit 149, a leakage determining signal is inputted, and a reference voltage in accordance with the leakage determining signal is outputted from the reference VSS voltage change circuit 149 to a positive (+) side input terminal of the amplifier 49.

To one connection part of the transistor 50, a negative (−) side input terminal of the amplifier 49 is connected, and this connection part serves as an output part of the ARVSS regulator 6. To a gate of the transistor 50, an output part of the amplifier 49 is connected, and to the other connection part of the transistor 50, the reference voltage VSS is coupled.

In FIG. 1, the leakage type determining circuit 7 serving as a leakage type determining unit determines which one of leakage components of the memory cells is larger between a current value indicating a sum of gate leakage components and substrate leakage components and a current value indicating channel leakage components when the SRAM module 12 turns to a resume standby mode (mode in which the memory cell can retain data and becomes at a retention voltage VDR lower than the power supply voltage at the time of normal read or write operation to reduce a leakage current while retaining data of the memory cells).

Then, the determination result is outputted as a leakage determining signal to the VDDR regulator 5 as a first voltage control unit and the ARVSS regulator 6 as a second voltage control unit.

Power supply interruption generally means that a current path in a circuit connected between a line to which a power supply voltage is to be supplied and a line to which a ground voltage is to be supplied is interrupted at any point.

The power supply control circuit 8 outputs any of resume standby signals RS and RS1 to RS3 indicating whether the mode is the resume standby mode and power supply interruption signals PSW1 to PSW3 in accordance with the operation mode of the regions 2 to 4. The resume standby signal RS is a signal obtained by taking the logical sum of the resume standby signals RS1 to RS3, and is outputted to the VDDR regulator 5, the ARVSS regulator 6, and the leakage type determining circuit 7.

The resume standby signals RS1 to RS3 are outputted to the regions 2 to 4, respectively, for the mode switching of the regions 2 to 4 between the resume standby mode and a normal operation mode.

For example, the normal operation mode is a mode in which data reading and writing are performed from and to the SRAM modules 12. When a module is in the normal operation mode, it means that it is in a normal operation state.

The power supply interruption signals PSW1 to PSW3 are signals for turning ON/OFF a switch 13 connected between the logic circuit 11 and the ground line to which the reference voltage VSS is given and a switch 14 connected between the SRAM modules 12 and the selector switch 10, thereby selecting the mode between the normal operation mode and the power supply interruption mode.

A VDD power supply line to which the externally-inputted power supply voltage VDD is supplied, a VDDR power supply line to which the power supply voltage VDDR generated by the VDDR regulator 5 is given, and a cell power supply line to which the logic circuit 11 and the SRAM modules 12 are connected are connected to the selector switch 9.

Based on the power supply interruption signals PSW1 to PSW3, the selector switch 9 switches the connection destination of the cell power supply line to the VDD power supply line or the VDDR power supply line to which the power supply voltage VDDR is given.

The ground line to which the reference voltage VSS is given, an ARVSS power supply line to which the cell source power supply voltage ARVSS generated by the ARVSS regulator 6 is given, and the cell source power supply line to which the switch 14 is connected are connected to the selector switch 10.

Based on the power supply interruption signals PSW1 to PSW3, the selector switch 10 switches the connection destination of the cell source power supply line to the ground line or the ARVSS power supply line.

The selector switch 9 includes, as shown in FIG. 4, transistors 51 to 54 and an inverter 55. The transistors 51 and 53 are each formed of an N-channel MOS, and the transistors 52 and 54 are each formed of a P-channel MOS. The transistors 51 and 52 form a switch, and the transistors 53 and 54 form a switch, respectively.

The power supply voltage VDD is coupled to one connection part of the transistor 51 and one connection part of the transistor 52 so that the power supply voltage VDD is supplied via the VDD power supply line. The output from the VDDR regulator 5 is coupled to one connection part of the transistor 53 and one connection part of the transistor 54 so that the output from the VDDR regulator 5 is inputted via the VDDR power supply line.

To the other connection part of the transistor 51 and the other connection part of the transistor 52, the other connection part of the transistor 53 and the other connection part of the transistor 54 are connected, respectively. These connection parts serve as an output part of the selector switch 9, and the cell power supply line is connected to these connection parts.

The resume standby signals RS1 to RS3 are connected to the gate of the transistor 52, the gate of the transistor 53, and an input part of the inverter 55 so that the resume standby signals RS1 to RS3 are inputted via a resume line.

Also, to an output part of the inverter 55, the gate of the transistor 54 and the gate of the transistor 51 are connected.

In the selector switch 9, based on the resume standby signal RSi (i=1 to 3), any one of the switch formed of the transistors 51 and 52 and the switch formed of the transistors 53 and 54 turns to a conductive state, and any one of the power supply voltage VDD and the power supply voltage VDDR is outputted to the cell power supply line.

The selector switch 10 includes, as shown in FIG. 5, transistors 56 to 59 and an inverter 60. The transistors 56 and 58 are each formed of an N-channel MOS, and the transistors 57 and 59 are each formed of a P-channel MOS. The transistors 56 and 57 form a switch, and the transistors 58 and 59 form a switch, respectively.

To one connection parts of the transistors 56 and 57, an output from the ARVSS regulator 6 is coupled so that an output from the ARVSS regulator 6 is inputted via the ARVSS power supply line. To one connection parts of the transistors 58 and 59, the reference voltage VSS is coupled via the ground line, and to the gates of the transistors 57 and 58, the power supply interruption signals PSW1 to PSW3 are connected so that the power supply interruption signals PSW1 to PSW3 are inputted via an interruption signal line.

To the other connection parts of the transistors 56 and 57, the other connection parts of the transistors 58 and 59 are connected, respectively, and these connection parts serve as an output part of the selector switch 10, and the cell source power supply line is connected to these connection parts. Since the other connection structure is similar to that of the selector switch 9 of FIG. 4, the description thereof is omitted here.

Also in this case, based on the power supply interruption signal PSWi (i=1 to 3), any one of the switch formed of the transistors 56 and 57 and the switch formed of the transistors 58 and 59 turns to a conductive state, and any one of the reference voltage VSS and the cell source power supply voltage ARVSS is outputted to the cell source power supply line.

FIG. 6 is a diagram for describing an example of memory cells MS provided in a memory array MA in the module 12.

As shown in the drawing, the memory cells MS each include transistors 15 to 20. The transistors 15, 16, 18, and 20 are each formed of an N-channel MOS (Metal Oxide Semiconductor), and the transistors 17 and 19 are each formed of a P-channel MOS.

The transistors 17 and 18 and the transistors 19 and 20 each have an inverter structure, and these two inverters form a latch circuit. To the gates of the transistors 15 and 16, a word line WL is connected, and to one connection parts of the transistors 15 and 16, a bit line BL and a bit line/BL to which an inverted signal of the bit line BL is given are connected, respectively.

To one connection parts of the transistors 17 and 19 forming one inverter, a cell power supply line is connected. To the other connection part of the transistor 17, one connection parts of the transistors 15 and 18 and the gates of the transistors 19 and 20 are connected.

To the other connection part of the transistor 19, one connection parts of the transistors 16 and 20 and the gates of the transistors 17 and 18 are connected. Also, to the other connection parts (sources) of the transistors 18 and 20, the cell source power supply line is connected.

To the back gates (wells) of the transistors 15, 16, 18, and 20, a cell substrate power supply line is connected, and a cell substrate power supply voltage VSSR is supplied via the cell substrate power supply line.

Between the VDD power supply line and the cell substrate power supply line, a structure is formed in which a word line driver 61 and a transistor 62 formed of an N-channel MOS are connected in series. The word line driver 61 drives the word line WL for selection of the memory cell MS. To the word line driver 61, the word line WL is connected, and to the gate of the transistor 62, the resume standby signal RS1 is connected so that the resume standby signal RS1 is inputted.

FIG. 7 is a timing chart of an example of operation in the semiconductor integrated circuit device 1.

FIG. 7 shows, from above to below, the resume standby signals RS1, RS2, RS3, and RS to be supplied to the resume line of the power supply control circuit 8, the leakage determining signal to be supplied to the leakage determining line of the leakage type determining circuit 7, the power supply interruption signals PSW1, PSW2, and PSW3 to be supplied to the power supply interruption line of the power supply control circuit 8, a power supply voltage VDDR1 to be supplied to the SRAM modules 12 of the region 2 via the cell power supply line, a cell source power supply voltage ARVSS1 to be supplied to the SRAM modules 12 of the region 2 via the cell source power supply line, and a cell substrate power supply voltage VSSR1 to be supplied to the back gates (wells) of the NMOS transistors of the memory cells via the cell substrate power supply line.

Similarly, power supplies to be supplied to the respective power supply lines of the region 3 are each provided with 2 after a symbol of each power supply. For example, a power supply to be supplied to the cell power supply line is represented as VDDR2. Similarly, power supplies to be supplied to the respective power supply lines of the region 4 are each provided with 3 after a symbol of each power supply.

First, in a period T1 of FIG. 7, when the regions 2 to 4 are in normal operation, the resume standby signals RS1, RS2, RS3, and RS to be applied to the resume line are Lo signals, and the power supply interruption signals PSW1 to PSW3 to be applied to the power supply interruption line are Hi signals.

Also, to the cell power supply lines of the regions 2 to 4 (power supply voltages VDDR1 to VDDR3), for example, the power supply voltage VDD of about 1.0 V to 1.5 V is supplied, and to the cell source power supply lines of the regions 2 to 4 (cell source power supply voltages ARVSS1 to ARVSS3), the reference voltage VSS is supplied.

Then, a transition is made to a period T2 in which the region 2 makes a transition from the normal operation to the resume standby mode (for example, internal voltage of the region 2: about 0.7 V to 0.8 V) and the region 4 makes a transition to the power supply interruption mode. The region 3 is in normal operation.

When a transition is made from the period T1 to the period T2, in the resume standby mode, the leakage type determining circuit 7 determines which one of the components of the leakage current is larger between the current value indicating the sum of a gate leakage current (hereinafter referred to as a gate leakage) and a substrate leakage current (hereinafter referred to as a substrate leakage) and the current value indicating a channel leakage current (hereinafter referred to as a channel leakage).

In this period T2, it is assumed that the current value indicating the sum of the gate leakage and the substrate leakage is larger than the current value indicating the channel leakage. As such, the state in which the region 2 makes a transition from the normal operation to the resume standby mode and the current value indicating the sum of the gate leakage and the substrate leakage is larger than the current value indicating the channel leakage is referred to as a first state.

In the first state, when it is determined that the current value indicating the sum of the gate leakage and the substrate leakage is larger than the current value indicating the channel leakage, the result is outputted as a leakage determining signal of a Lo signal to the leakage determining line.

Upon reception of the leakage determining signal, the power supply control circuit 8 outputs the resume standby signals RS and RS1 of Hi signals to the resume line. When the resume standby signal RS is inputted, the VDDR regulator 5 generates the power supply voltage VDDR at the first voltage level lower than that of the power supply voltage VDD, and this power supply voltage VDDR is supplied to the SRAM modules 12 via the VDDR power supply line, the selector switch 9, and the cell power supply line.

Note that the power supply voltage VDDR at the first voltage level generated by the VDDR regulator 5 is a voltage with which the memory cells MS can retain data, and is not decreased to a voltage with which data cannot be retained. Here, for example, the voltage of about 1 V is decreased to about 0.7 V.

In this manner, the voltage lower than the power supply voltage VDD is supplied as a cell power supply of the transistors 17 and 19 forming the memory cell MS, thereby decreasing the gate leakage, the substrate leakage, and the channel leakage compared with those before decreasing the voltage.

Also, since the region 4 is in the power supply interruption mode, the switches 13 and 14 are turned OFF, and the cell source power supply line and the cell power supply line are separated from the source power supply line.

Then, in a period T3, the regions 2 to 4 turn to the normal operation, and therefore the signal state is the same as that in the period T1. Then, in a period T4, the region 2 again makes a transition from the normal operation to the resume standby mode, and the region 4 makes a transition to the power supply interruption mode.

In this period T4, it is assumed that the current value indicating the channel leakage is larger than the current value indicating the sum of the gate leakage and the substrate leakage. Here, the state in which the region 2 makes a transition from the normal operation to the resume standby mode and the current value indicating the channel leakage is larger than the current value indicating the sum of the gate leakage and the substrate leakage is referred to as a second state.

In the resume standby mode in the period T4, the leakage type determining circuit 7 determines that the current value indicating the channel leakage is larger than the current value indicating the sum of the gate leakage and the substrate leakage, and outputs the determination result as a leakage determining signal of a Hi signal via the leakage determining line.

Upon reception of the leakage determining signal, the power supply control circuit 8 outputs the resume standby signals RS and RS1 of Hi signals via the resume line. When the resume standby signal RS is inputted, the VDDR regulator 5 generates the power supply voltage VDDR at the second voltage level higher than the first voltage level in the period T2 and lower than the power supply voltage VDD, and supplies the power supply voltage VDDR to the SRAM modules 12 of the region 2 via the selector switch 9 and the cell power supply line.

When the resume standby signal RS is inputted, the ARVSS regulator 6 supplies a first source voltage at a voltage level higher than that of the reference voltage VSS to the SRAM modules 12 of the region 2 via the selector switch 10, the switch 14, and the cell source power supply line.

Here, in the resume standby mode, a relation between the power supply voltage VDDR and the cell source power supply voltage ARVSS preferably satisfies the condition of "power supply voltage VDDR−cell source power supply voltage ARVSS=constant".

Here, a comparison is made between the period T2 and the period T4.

For example, it is assumed in the period T2 that the power supply voltage VDDR=0.7 V, the cell source power supply voltage ARVSS=0 V, and a well voltage (also called a back gate voltage) of NMOS transistor=0 V. For example, it is assumed in the period T4 that the power supply voltage VDDR=0.85 V, the cell source power supply voltage ARVSS=0.15 V, and a well voltage (also called a back gate voltage) of NMOS transistor=0 V.

Here, the NMOS transistors 18 and 20 of FIG. 6 are studied.

Since these two transistors 18 and 20 form a pair of the latch circuit, different voltages are applied thereto.

Here, by way of example, it is assumed that a Hi signal is present on the drain side of the transistor 18 of FIG. 6 (node A of FIG. 6) and a Lo signal is present on the drain side of the transistor 20 (node B of FIG. 6).

In the period T2, a drain-source voltage of the transistor 18 is 0.7 V, and a drain-well voltage thereof is 0.7 V. Also, a gate-well voltage of the transistor 20 is 0.7 V. Furthermore, a gate-drain voltage of both transistors is 0.7 V.

On the other hand, in the period T4, the drain-source voltage of the transistor 18 is 0.7 V, and the drain-well voltage thereof is 0.85 V. Also, the gate-well voltage of the transistor 20 is 0.85 V. Furthermore, the gate-drain voltage of both transistors is 0.85 V.

In the period T2, compared with the period T4, the drain-well voltage, the gate-well voltage, and the gate-drain voltage are low. Therefore, though the details thereof will be described further below with reference to FIG. 15, the substrate leakage and the gate leakage (the gate-drain leakage and the gate-well leakage) can be suppressed more in the period T2 than in the period T4.

On the other hand, since the source voltage is increased in the period T4 compared with the period T2, a threshold voltage of the transistor is increased. Therefore, the channel leakage can be suppressed more compared with the period T2.

As described above, when the current value indicating the sum of the substrate leakage and the gate leakage is larger than the current value indicating the channel leakage, decreasing the power supply voltage VDDR like in the period T2 is effective for the leakage suppression.

On the other hand, when the current value indicating the sum of the substrate leakage and the gate leakage is smaller than the current value indicating the channel leakage, reducing the amount of decreasing the power supply voltage VDDR more than the amount in the period T2 and increasing the voltage of the source voltage line like in the period T4 is effective for the leakage suppression.

As described above, by switching the way to give the voltage depending on the factor of the leakage, the current of the SRAM module 12 can be suppressed even with any leakage factor.

Also, in FIG. 7, in the case of large channel leakage, the power supply voltage VDDR at the second voltage level is generated and supplied. Alternatively, for example, as shown in the period T4 of FIG. 8, the power supply voltage VDDR at the same voltage level as that in the normal operation may be supplied, and in return, the voltage of the cell source power supply voltage ARVSS to be supplied to the cell source power supply line may be set at a second source voltage higher than the first source voltage.

Also in this case, a value obtained by subtracting the second source voltage from the power supply voltage VDDR is preferably constant so as to satisfy the condition of "power supply voltage VDDR−cell source power supply voltage ARVSS=constant".

In the above, the example in which the region 2 is in the resume standby mode has been described. Also, the period T2 in which the current value indicating the sum of the gate leakage and the substrate leakage is larger than the current value indicating the channel leakage and the period T4 in which the current value indicating the channel leakage is larger than the current value indicating the sum of the gate leakage and the substrate leakage has been described.

A relation in magnitude of the leakages is normally less prone to be significantly varied depending on the period unless there are considerable circumstances such as the change in temperature of the semiconductor device.

Temperature changes will be described further below with reference to FIG. 16, FIG. 17, and others.

FIG. 7 shows the case where different properties are exhibited between the period T2 and the period T4 for convenience. In general, the state often becomes either one of the states in the period T2 and the period T4.

As described above, by changing the voltages to be applied to the power supply line and the cell source line of the memory cells MS depending on the relation in magnitude of the leakages, the leakage current of the SRAM modules 12 in the resume standby mode can be decreased in accordance with the leakage type (substrate leakage+gate leakage or channel leakage).

Also, like in the region 4 in the period T2 and the period T4, the power supply is interrupted by turning OFF the switches 13 and 14 of a current path of the ground line and the cell source power supply line. By this means, the data in the SRAM modules 12 in the region 4 is lost, but current consumption can be decreased. Furthermore, the leakage current of the logic circuit 11 can be reduced.

As such, by dividing the region, current consumption of a region where operation is not required or data loss is allowed can be suppressed.

Furthermore, although the switches 13 and 14 for interruption in the logic circuit 11 and the SRAM modules 12 are controlled with the same signal in this example, they may be controlled separately.

As described above, by interrupting the power supply and controlling the cell power supply line and the cell source power supply line for each region, as the entire semiconductor integrated circuit device, a voltage is supplied only to a portion where operation and data retention are required and the voltages of other parts are interrupted and optimized, thereby reducing the current consumption.

FIG. 9 is a diagram for describing an example of the leakage type determining circuit 7.

The leakage type determining circuit 7 includes, as shown in the drawing, transistors 21 to 23, a leakage determining transistor unit 24, an operational amplifier 25, a transistor 26, inverters 27 to 30, and a flip-flop 31.

The transistors 21 to 23 are each formed of a P-channel MOS, and to one connection part of the transistor 21, the power supply voltage is coupled so that the power supply voltage is supplied. To the other connection part of the transistor 21, one connection parts of the transistors 22 and 23 are connected.

The leakage determining transistor unit 24 includes a first transistor unit having m (natural number) transistors TL1 connected in parallel and a second transistor unit having n (natural number) transistors TL2 connected in parallel.

In the first transistor unit, one connection part of each of the transistors TL1 serving as a first leakage measurement transistor and the other connection part of the transistor TL1 are connected to the other connection part of the transistor 22, and the gates of the transistors TL1 are commonly coupled to the reference voltage VSS.

In the second transistor unit, one connection part of each of the transistors TL2 serving as a second leakage measurement transistor is connected to the other connection part of the transistor 22, and the other connection part and the gate of the transistor TL2 are commonly coupled to the reference voltage VSS.

The transistor TL1 is a transistor which measures leakage currents of the gate leakage and the substrate leakage, and the transistor TL2 is a transistor which measures a leakage current of the channel leakage.

To a connection part between the transistor 22 and the first transistor unit, a positive (+) side input terminal of the operational amplifier 25 is connected, and to a connection part between the transistor 23 and the second transistor unit, a negative (−) side input terminal of the operational amplifier 25 is connected.

To an output part of the operational amplifier 25, an input part of the inverter 30 is connected, and to an output part of the inverter 30, an input terminal of the flip-flop 31 is connected. The operational amplifier 25 is coupled to the reference voltage VSS via the transistor 26.

To a clock terminal of the flip-flop 31 and an input terminal of the inverter 29, the resume standby signal RS is coupled so that the resume standby signal RS is inputted. The inverters 27 to 29 are connected in series, and to an output part of the inverter 27, the gate of the transistor 26 is connected.

A current flowing through a connection part between the transistor 22 and the first transistor unit and a current flowing through a connection part between the transistor 23 and the second transistor unit are converted to a potential difference by the operational amplifier 25 and outputted as a leakage determining signal.

In this case, the leakage type determining circuit 7 outputs a Lo signal as a leakage determining signal when the current value indicating the sum of the gate leakage and the substrate leakage is larger than the current value indicating the channel leakage, and outputs a Hi signal as a leakage determining signal when the current value indicating the sum of the gate leakage and the substrate leakage is smaller than the current value indicating the channel leakage.

Also, the first and second transistor units of the leakage type determining circuit 7 may not have a plurality of transistors, but each may be configured to have a relevant one of the transistors TL1 and TL2. However, with the structure of the plurality of transistors TL1 and the plurality of transistors TL2 connected in parallel, a detection error due to element variations can be reduced, and the leakage type can be more accurately determined.

FIG. 10 is a diagram for describing an example of layout of the memory array MA provided in each of the regions 2 to 4. FIG. 11 is a diagram for describing an example of layout of the leakage determining transistor unit 24 in the leakage type determining circuit 7.

As shown in the drawing, in the memory array MA, the memory cells (FIG. 6), which are minimum units for storage, are orderly arranged in an array. Also, as shown in FIG. 11, the leakage determining transistor unit 24 in the leakage type determining circuit 7 has a layout in which the memory cells MS shown in FIG. 10 are arranged in, for example, two columns.

In the memory cells MS of FIG. 11, from left to right, the transistor 15, the transistor 17, the transistor 19, and the transistor 16 shown in FIG. 6 are laid out.

In this structure, the transistors 15 and 16 of the memory cells MS arranged in one column on the left side are used as transistors TL1, and the transistors 15 and 16 of the memory cells MS arranged in one column on the right side are used as transistors TL2.

As such, by using the transistors having the same layout as that of the memory cells MS, the discrepancy in electrical characteristics and others can be significantly reduced.

FIG. 12 to FIG. 14 are diagrams for describing other examples of the leakage type determining circuit 7 of FIG. 9.

In FIG. 12, the leakage type determining circuit 7 includes the leakage determining transistor unit 24, the operational amplifier 25, the transistor 26, the inverters 27 to 30, and the flip-flop 31.

Also, the leakage determining transistor unit 24 includes the plurality of transistors TL1 which measure leakage currents of the gate leakage and the substrate leakage and the plurality of transistors TL2 which measure a leakage current of the channel leakage.

To one connection part of each of the transistors TL1 and the other connection part of the transistor TL1, the power supply voltage is coupled so that the power supply voltage is supplied, and to the gate of each of the transistors TL2 and the other connection part of the transistor TL2, the reference voltage VSS is coupled.

The gates of the transistors TL1 and one connection parts of the transistors TL2 are commonly connected to the negative (−) side input terminal of the operational amplifier 25. To the positive (+) side input terminal of the operational amplifier 25, the reference voltage VREF is coupled so that the reference voltage VREF is inputted. The other connection structure is similar to that of FIG. 9.

The operational amplifier 25 determines the leakage type depending on the voltage levels of the reference voltage VREF and the voltage of the leakage determining transistor unit 24. For example, when the voltage outputted from the leakage determining transistor unit 24 is higher than the reference voltage VREF, it is determined that the current value indicating the channel leakage is larger than the current value indicating the sum of the gate leakage and the substrate leakage.

When the voltage outputted from the leakage determining transistor unit 24 is lower than the reference voltage VREF, it is determined that the current value indicating the sum of the gate leakage and the substrate leakage is larger than the current value indicating the channel leakage.

In FIG. 13, the leakage type determining circuit 7 includes the leakage determining transistor unit 24, the operational amplifier 25, the transistor 26, the inverters 27 to 30, the flip-flop 31, and a constant current source 32.

The leakage determining transistor unit 24 includes the plurality of transistors TL1 which measure leakage currents of the gate leakage and the substrate leakage, and to one connection parts of the transistors TL1 and the other connection parts of the transistors TL1, the power supply voltage is coupled so that the power supply voltage is supplied. To the gate of the each of transistors TL1, the constant current source 32 is connected.

To the negative (−) side input terminal of the operational amplifier 25, a connection part between the gate of each of the transistors TL1 and the constant current source 32 is connected, and to the positive (+) side input terminal of the operational amplifier 25, the reference voltage VREF is coupled so that the reference voltage VREF is inputted. The other connection structure is similar to that of FIG. 9.

In this case, the operational amplifier 25 compares the reference voltage VREF and the voltage of the leakage determining transistor unit 24, and when the output voltage of the leakage determining transistor unit 24 is higher than the reference voltage VREF, the operational amplifier 25 determines whether the current value indicating the sum of the gate leakage and the substrate leakage is larger than the current value indicating the channel leakage.

In FIG. 14, the leakage type determining circuit 7 includes the leakage determining transistor unit 24, the operational amplifier 25, the transistor 26, the inverters 27 to 30, the flip-flop 31, and a constant current source 33.

The leakage determining transistor unit 24 includes the plurality of transistors TL2 which measure a leakage current of the channel leakage. To one connection parts of the transistors TL2, the constant current source 33 is connected, and to the other connection part and the gate of each of the transistors TL2, the reference voltage VSS is coupled.

To the positive (+) side input terminal of the operational amplifier 25, the reference voltage VREF is coupled so that the reference voltage VREF is inputted, and to the negative (−) side input terminal of the operational amplifier 25, a connection part between one connection part of each of the transistors TL2 and the constant current source 33 is connected.

The operational amplifier 25 compares the reference voltage VREF and the voltage of the leakage determining transistor unit 24, and determines that the channel leakage is increased when the voltage outputted from the leakage determining transistor unit 24 is higher than the reference voltage VREF.

FIG. 15 is a diagram for describing leakage current components in a transistor T formed of an N-channel MOS.

As described above, the transistor T has leakage current components of the channel leakage, the gate leakage, and the substrate leakage.

As shown in the drawing, in the transistor T, the channel leakage is a leakage current flowing from a drain D to a source S, the gate leakage is a leakage current flowing from the drain D to a gate G. Also, the substrate leakage is a leakage current flowing from the drain D to a semiconductor substrate. The same is true for a P-channel MOS transistor although the voltage applying conditions are different.

FIG. 16 is a table for describing a ratio of each of the leakage current components in the transistor T.

Since a plurality of transistors of this type are used in the memory cell MS, the ratio can be considered as a ratio of leakage currents in a memory array. Note that the room temperature is approximately 25° C., and a high temperature is approximately 125° C.

In this FIG. 16, a channel leakage in the transistor T at the room temperature is taken as 1. At the room temperature, similarly, the gate leakage is 0.3, and the substrate leakage is 1.5. Also, at the high temperature, the channel leakage is 100, which is approximately 100 times as large as that at the room temperature, and the substrate leakage is increased from 1.5 at the room temperature to 5.

FIG. 17 is a table for describing an example of a leakage reduction effect of the present invention.

In FIG. 17, a leakage current when only the power supply voltage VDDR supplied via the cell power supply line is voltage-controlled (VDD-controlled) is taken as 1. In the present invention (present technique), at the room temperature, the leakage current is the same as that in the case where the power supply voltage VDDR is voltage-controlled. However, at the high temperature, the leakage current is reduced to approximately half of the case where the power supply voltage VDDR is voltage-controlled.

Furthermore, at the room temperature, the leakage current is 1.5 when only the cell source power supply voltage ARVSS is voltage-controlled, but when the present invention is applied, the leakage current becomes 1 as described above, and the leakage current can be reduced in both cases of the room temperature and the high temperature.

In this manner, according to the first embodiment, even if any of the leakage current components, that is, the current value indicating the channel leakage and the current value indicating the sum of the gate leakage and the substrate leakage are increased, the leakage current can be significantly reduced in accordance with the leakage type. Therefore, low power consumption of the semiconductor integrated circuit device 1 can be achieved.

Also, in the first embodiment, the structure of FIG. 3 is shown as a structure provided with the ARVSS regulator 6 which generates the cell source power supply voltage ARVSS. However, the structure may be such that, in place of using this highly-accurate regulator which generates the cell source power supply voltage ARVSS, a power supply circuit which generates the cell source power supply voltage ARVSS using a diode connection MOS transistor or the like is provided for each of the SRAM modules 12 in the regions 2 to 4.

Second Embodiment

Figure 18:
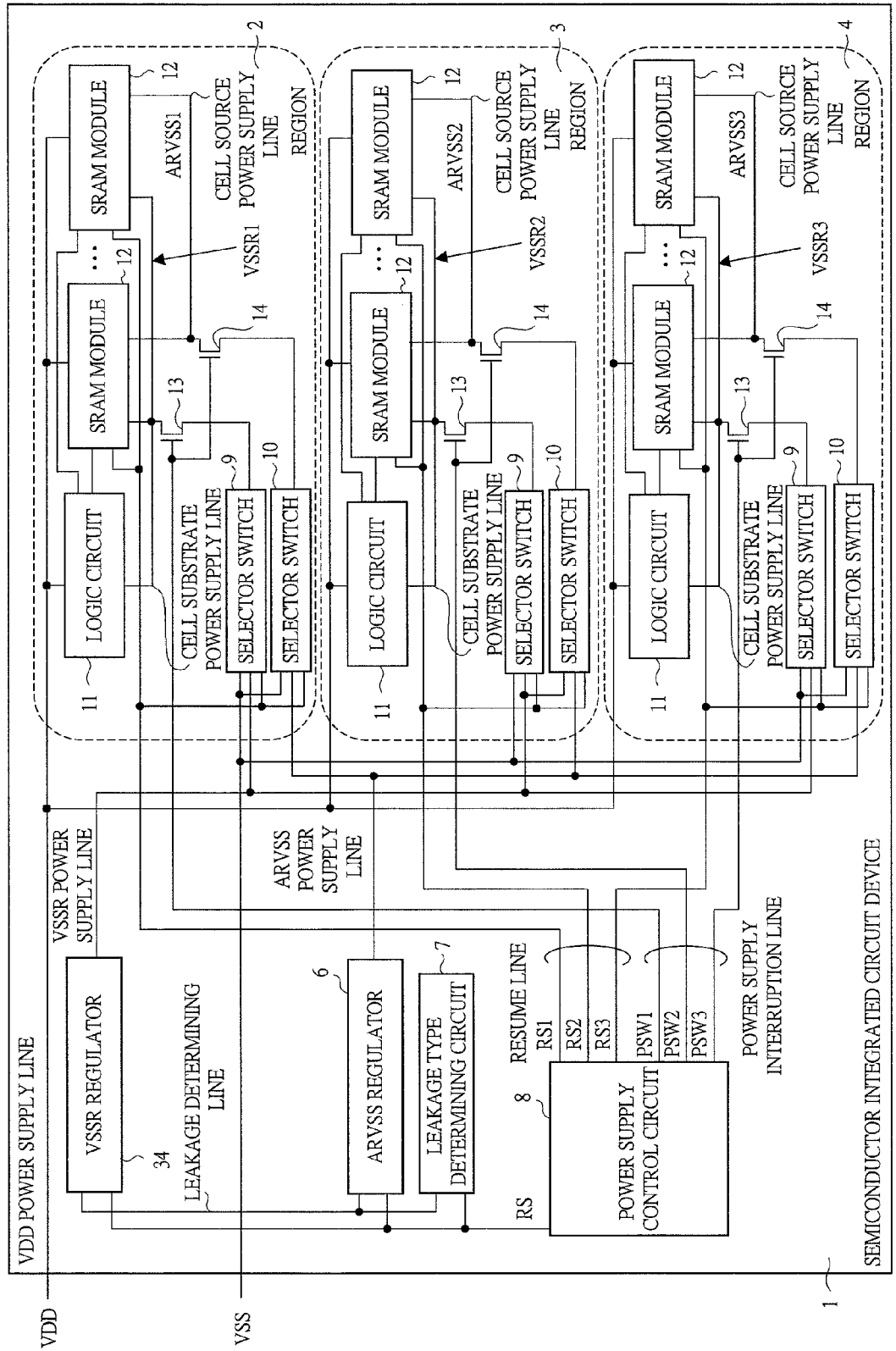
FIG. 18 is a block diagram of an example of a semiconductor integrated circuit device according to a second embodiment of the present invention.
Figure 19:
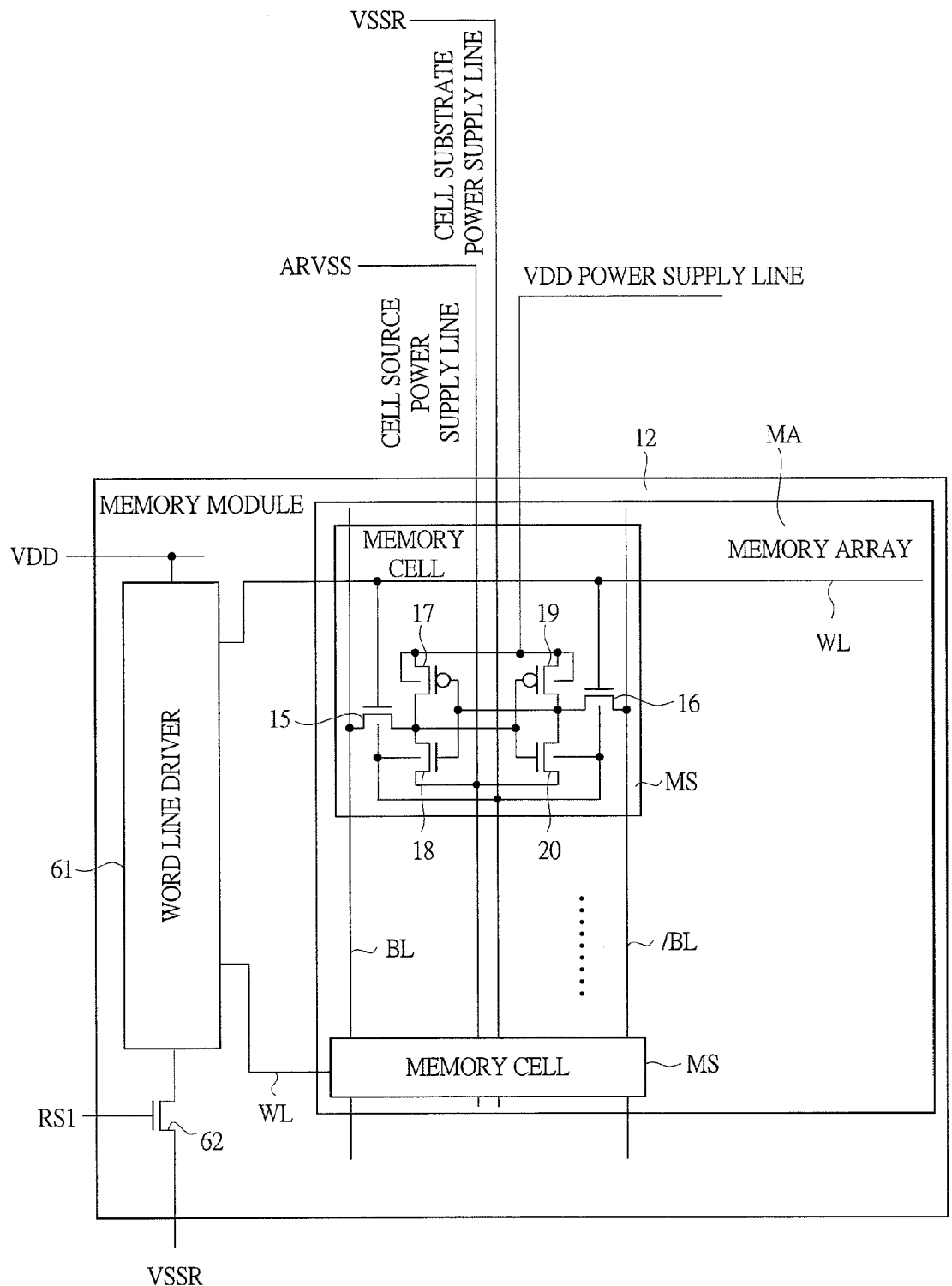
FIG. 19 is a diagram for describing an example of memory cells provided in an SRAM module in the semiconductor integrated circuit device of FIG. 18.
Figure 20:
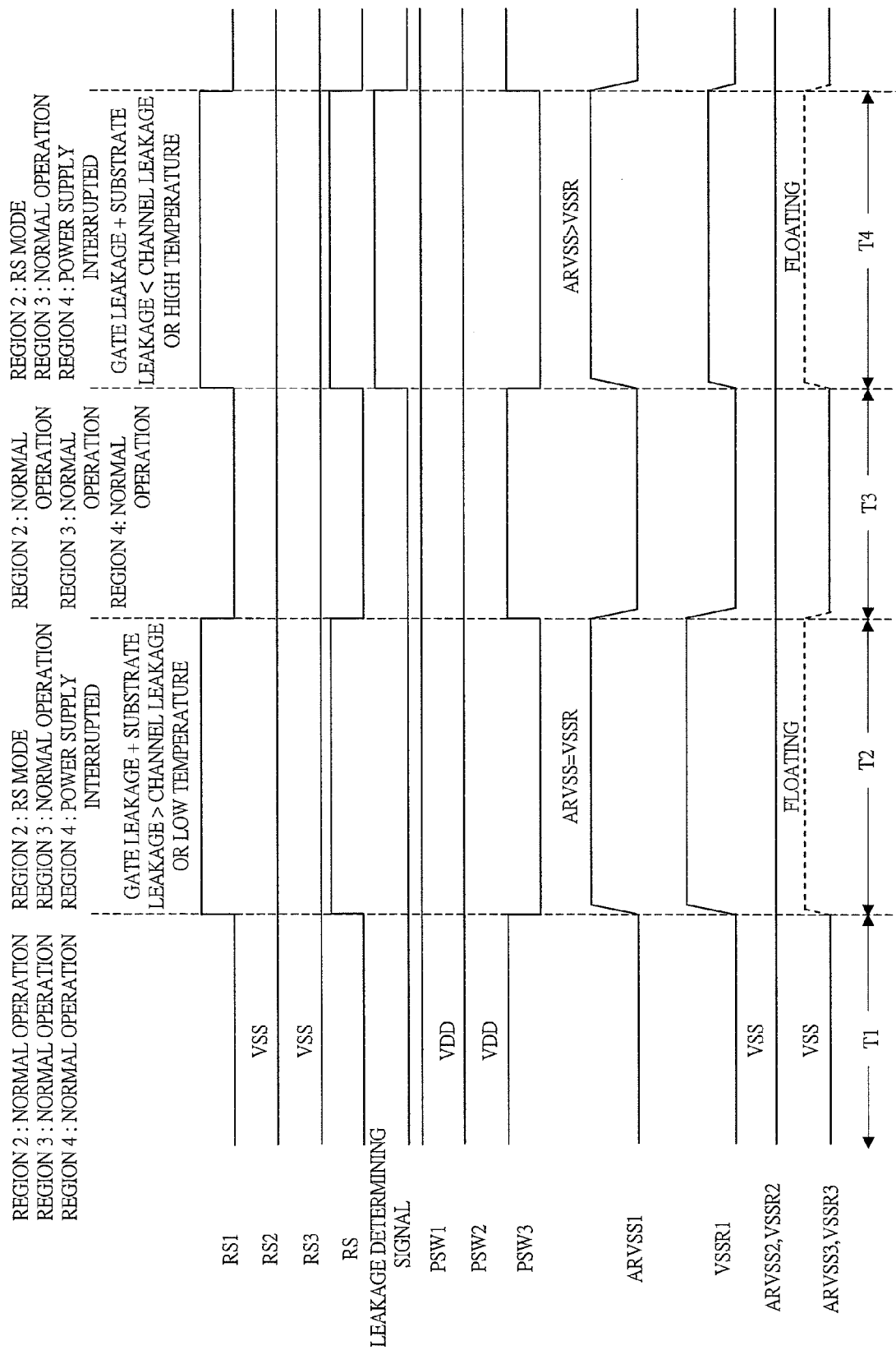
FIG. 20 is a timing chart of an example of operation in the semiconductor integrated circuit device of FIG. 18.

FIG. 18 is a block diagram of an example of a semiconductor integrated circuit device according to a second embodiment of the present invention. FIG. 19 is a diagram for describing an example of memory cells provided in an SRAM module in the semiconductor integrated circuit device of FIG. 18. FIG. 20 is a timing chart of an example of operation in the semiconductor integrated circuit device of FIG. 18.

General Outlines of Second Embodiment

General outlines of the second embodiment are as follows. Differences from the first embodiment are mainly described.

A back gate voltage line (cell substrate power supply line) for giving a back gate voltage to a back gate of N-type MOS transistors of the memory cells is provided.

In the standby state, the static memory can be set any one of a third state and a fourth state.

In the third state, the voltage of the cell source voltage line and the voltage of the back gate voltage line are equal to each other and are higher than the ground voltage. In the fourth state, the voltage of the back gate voltage line (substrate power supply line) is equal to or higher than the ground voltage and is lower than the voltage of the cell source voltage line.

The third state is such that, for example, a current value indicating a sum of a gate leakage and a substrate leakage is larger than a current value indicating a channel leakage in a resume standby mode. The fourth state is such that, for example, a current value indicating a sum of a gate leakage and a substrate leakage is smaller than a current value indicating a channel leakage in a resume standby mode.

The present embodiment will be described in detail below based on the general outlines described above.

In the second embodiment, the semiconductor integrated circuit device 1 includes, as shown in FIG. 18, the regions 2 to 4, the ARVSS regulator 6, the leakage type determining circuit 7, the power supply control circuit 8, and a VSSR regulator 34. A difference from FIG. 1 of the first embodiment is that the VSSR regulator 34 is provided in place of the VDDR regulator.

The VSSR regulator 34 is connected so that the resume standby signal RS outputted from the power supply control circuit 8 via the resume line and the leakage determining signal outputted via the leakage determining line of the leakage type determining circuit 7 are inputted.

Also, the VSSR regulator 34 is connected to the selector switches 9 provided in the regions 2 to 4 via a VSSR power supply line. The selector switches 9 switch between the reference voltage VSS and a cell substrate power supply voltage VSSR serving as a third voltage generated by the VSSR regulator 34 based on the resume standby signals RS1 to RS3 and output it to each of the SRAM modules 12 via the switch 14 and the cell substrate power supply line.

Between the selector switch 9 and the SRAM modules 12 and between the selector switch 9 and the logic circuit 11, the switch 13 is connected. This switch 13 turns ON/OFF based on the power supply interruption signals PSW1 to PSW3 outputted from the power supply control circuit 8 via the power supply interruption line. The other connection structure is similar to that of FIG. 1.

FIG. 19 is a diagram for describing an example of the memory cells MS provided in the memory array MA in each SRAM module 12 in the semiconductor integrated circuit device 1 shown in FIG. 18.

To one input parts and back gates of the transistors 17 and 19, the power supply voltage VDD is coupled so that the power supply voltage VDD is supplied via the VDD power supply line, and to back gates (wells where the transistors are formed) of the transistors 15, 16, 18, and 20, the cell substrate power supply line is connected.

In this case, the voltage level of the power supply voltage VDD to be supplied to the transistors 17 and 19 of the memory cell MS is not changed and the cell substrate power supply voltage VSSR to be supplied to the back gates (wells where the transistors are formed) of the transistors 15, 16, 18, and 20 is changed. This is the difference from the case of FIG. 6.

Also, the other connection structure of the memory cell MS and the connection structure of the word line driver 61 and the transistor 62 formed of an N-channel MOS are similar to those of FIG. 6.

FIG. 20 is a timing chart of an example of operation in the semiconductor integrated circuit device 1 of FIG. 18.

FIG. 20 shows, from above to below, signal timings of the resume standby signals RS1, RS2, RS3, and RS to be outputted via the resume line of the power supply control circuit 8, the leakage determining signal to be outputted via the leakage determining line of the leakage type determining circuit 7, the power supply interruption signals PSW1, PSW2, and PSW3 to be outputted via the power supply interruption line of the power supply control circuit 8, the cell source power supply voltage ARVSS1 to be supplied to the SRAM modules 12 of the region 2 via the cell source power supply line, the cell substrate power supply voltage VSSR1 to be supplied to the SRAM modules 12 of the region 2 via the cell substrate power supply line, a cell source power supply voltage ARVSS2 to be supplied to the SRAM modules 12 of the region 3 via the cell source power supply line and a cell substrate power supply voltage VSSR2 to be supplied to the SRAM modules 12 of the region 3 via the cell substrate power supply line, and a cell source power supply voltage ARVSS3 to be supplied to the SRAM modules 12 of the region 4 via the cell source power supply line and a cell substrate power supply voltage VSSR3 to be supplied to the SRAM modules 12 of the region 4 via the cell substrate power supply line.

Note that FIG. 20 also shows an example in which the region 2 is in the resume standby mode, and the current value indicating the sum of the gate leakage and the substrate leakage is larger than the current value indicating the channel leakage in the period T2 and the current value indicating the channel leakage is larger than the current value indicating the sum of the gate leakage and the substrate leakage in the period T4.

This FIG. 20 shows the case where different properties are exhibited between the period T2 and the period T4 for convenience. The relation in magnitude of the leakages is not normally varied significantly depending on the period, and the state often becomes either one of the states in the period T2 and the period T4 in general.

First, a period T1 of FIG. 20 is a period in which the regions 2 to 4 are in normal operation. In this period T1, the resume line to which the resume standby signals RS1, RS2, RS3, and RS are supplied is at a Lo signal level, and the power supply interruption line to which the power supply interruption signals PSW1 to PSW3 are supplied is at a Hi signal level.

Also, to the cell source power supply lines of the regions 2 to 4, the reference voltage VSS is supplied as the cell source power supply voltage ARVSS, and to the cell source power supply lines of the regions 2 to 4, the reference voltage VSS is supplied as the cell substrate power supply voltage VSSR.

Then, when a transition is made to the period T2 in which the region 2 makes a transition from the normal operation to the resume standby mode and the region 4 makes a transition to the power supply interruption mode, in the resume standby mode, the leakage type determining circuit 7 determines whether the current value indicating the sum of the gate leakage and the substrate leakage is larger than the current value indicating the channel leakage.

In this period T2, as described above, the current value indicating the sum of the gate leakage and the substrate leakage is larger than the current value indicating the channel leakage. Therefore, a leakage determining signal of a Lo signal is outputted as the determination result to the leakage determining line.

Here, the state in which the region 2 makes a transition from the normal operation to the resume standby mode and the current value indicating the sum of the gate leakage and the substrate leakage is larger than the current value indicating the channel leakage is taken as the third state.

Upon reception of the leakage determining signal, the power supply control circuit 8 supplies the resume standby signals RS and RS1 of Hi signals to the resume line. When the resume standby signal RS is inputted, the VSSR regulator 34 supplies the cell substrate power supply voltage VSSR to the SRAM modules 12 of the region 2 via the VSSR power supply line, the selector switch 9, the switch 13, and the cell substrate power supply line.

The ARVSS regulator 6 generates the cell source power supply voltage ARVSS having a voltage level higher than that of the reference voltage VSS and supplies it to the SRAM modules 12 of the region 2 via the ARVSS power supply line, the selector switch 10, the switch 14, and the cell source power supply line.

Here, it is assumed that the cell substrate power supply voltage VSSR1 and the cell source power supply voltage ARVSS1 have approximately the same voltage level.

Also, since the region 4 is in the power supply interruption mode, the switches 13 and 14 are turned OFF, the cell source power supply line and the cell substrate power supply line are interrupted from the source power supply line, and a current path of the logic circuit 11 and the SRAM modules 12 in the region 4 is interrupted.

In a period T3, the regions 2 to 4 are in normal operation. Therefore, the state becomes the same signal state as that of the period T1. Then, in the period T4, the region 2 again makes a transition from the normal operation to the resume standby mode, and the region 4 makes a transition to the power supply interruption mode.

At this time, in the resume standby mode, the leakage type determining circuit 7 determines whether the current value indicating the channel leakage of the leakage current components is larger than the current value indicating the sum of the gate leakage and the substrate leakage of the leakage current components.

In this period T4, the current value indicating the channel leakage is larger than the current value indicating the sum of the gate leakage and the substrate leakage. Therefore, the leakage type determining circuit 7 outputs a leakage determining signal of a Hi signal as the determination result to the leakage determining line. Here, the state in which the region 2 makes a transition from the normal operation to the resume standby mode and the current value indicating the channel leakage is larger than the current value indicating the sum of the gate leakage and the substrate leakage is taken as the fourth state.

Upon reception of the leakage determining signal, the power supply control circuit 8 outputs the resume standby signals RS and RS1 of Hi signals via the resume line. When the resume standby signal RS and the leakage determining signal are inputted, the ARVSS regulator 6 generates the cell source power supply voltage ARVSS having a voltage level similar to that in the period T2 and supplies it to the SRAM modules 12 of the region 2 via the selector switch 10, the switch 14, and the cell source power supply line.

Also, when the resume standby signal RS and the leakage determining signal are inputted, the VSSR regulator 34 generates the cell substrate power supply voltage VSSR having a voltage level higher than that of the reference voltage VSS and lower than that of the cell source power supply voltage ARVSS and supplies it to the SRAM modules 12 of the region 2 via the selector switch 9, the switch 13, and the cell substrate power supply line.

In this case, the cell substrate power supply voltage VSSR generated by the VSSR regulator 34 has a voltage level lower than that of the cell source power supply voltage ARVSS generated by the ARVSS regulator 6.

As such, when the current value indicating the sum of the gate leakage and the substrate leakage is larger than the current value indicating the channel leakage, by increasing the cell substrate power supply voltage VSSR and the cell source power supply voltage ARVSS, the drain-well voltage, the gate-well voltage, and the gate-drain voltage can be decreased in the period T2 compared with those in the period T4.

Also, when the current value indicating the sum of the gate leakage and the substrate leakage is smaller than the current value indicating the channel leakage, by setting the cell substrate power supply voltage VSSR at a voltage level lower than that of the cell source power supply voltage ARVSS, the threshold voltage of the transistor can be increased in the period T4 compared with that in the period T2.

In this manner, also in the second embodiment, even if any of the leakage current components, that is, the current value indicating the channel leakage and the current value indicating the sum of the gate leakage and the substrate leakage is increased, the leakage current can be significantly reduced. Therefore, low power consumption of the semiconductor integrated circuit device 1 can be achieved.

Furthermore, also in the second embodiment, the structure is such that the VSSR regulator 34 as shown in FIG. 18 is provided.

Alternatively, in place of providing a power supply circuit which generates a highly-accurate voltage such as the VSSR regulator 34, a power supply circuit which generates the cell source power supply voltage ARVSS may be formed of a power supply circuit with a simple circuit structure using a diode connection MOS transistor or the like and may be provided in each of the SRAM modules 12 of the regions 2 to 4.

Third Embodiment

Figure 21:
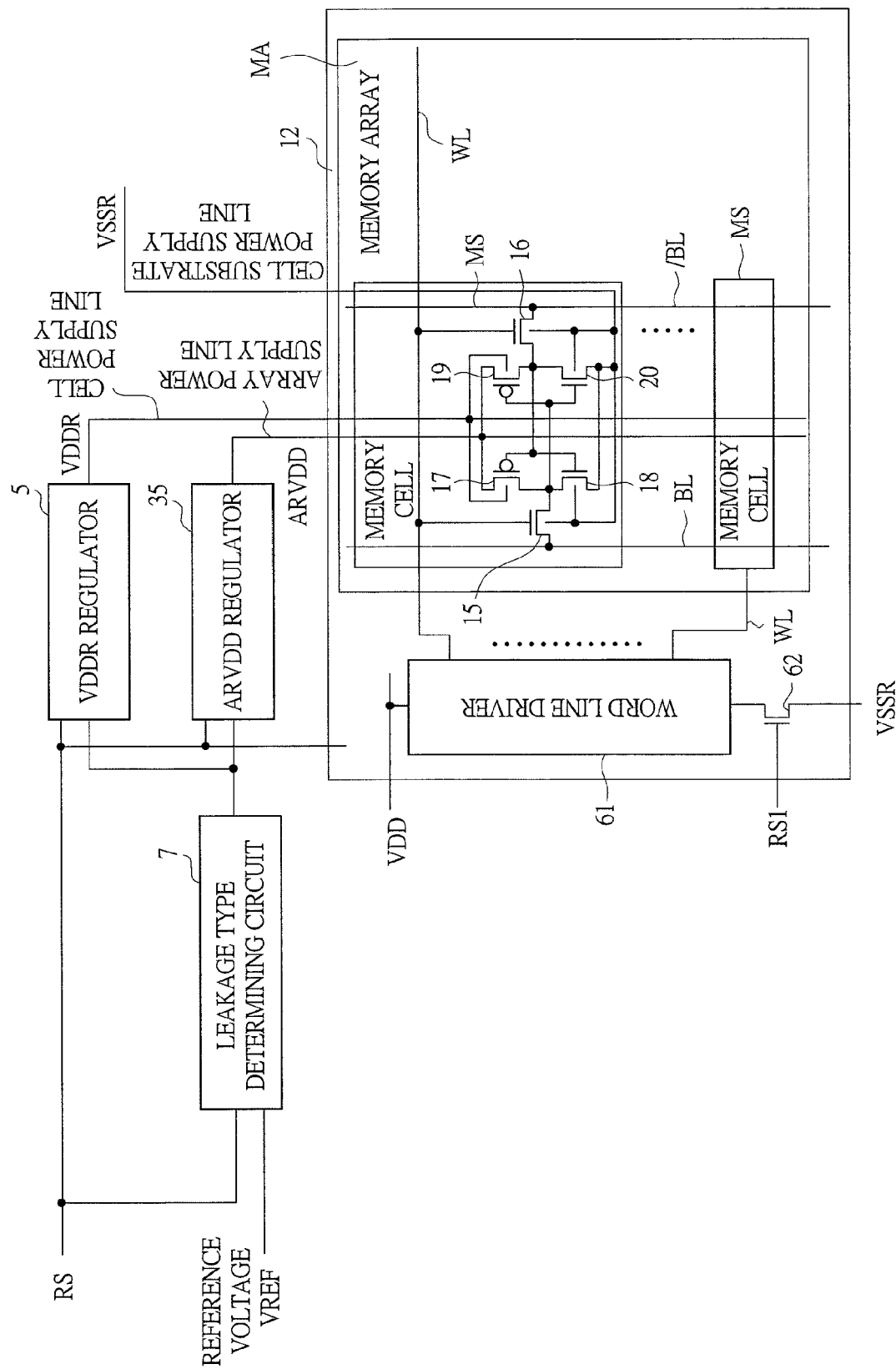
FIG. 21 is a diagram for describing an example of memory cells provided in a memory array in an SRAM module according to a third embodiment of the present invention.
Figure 22:
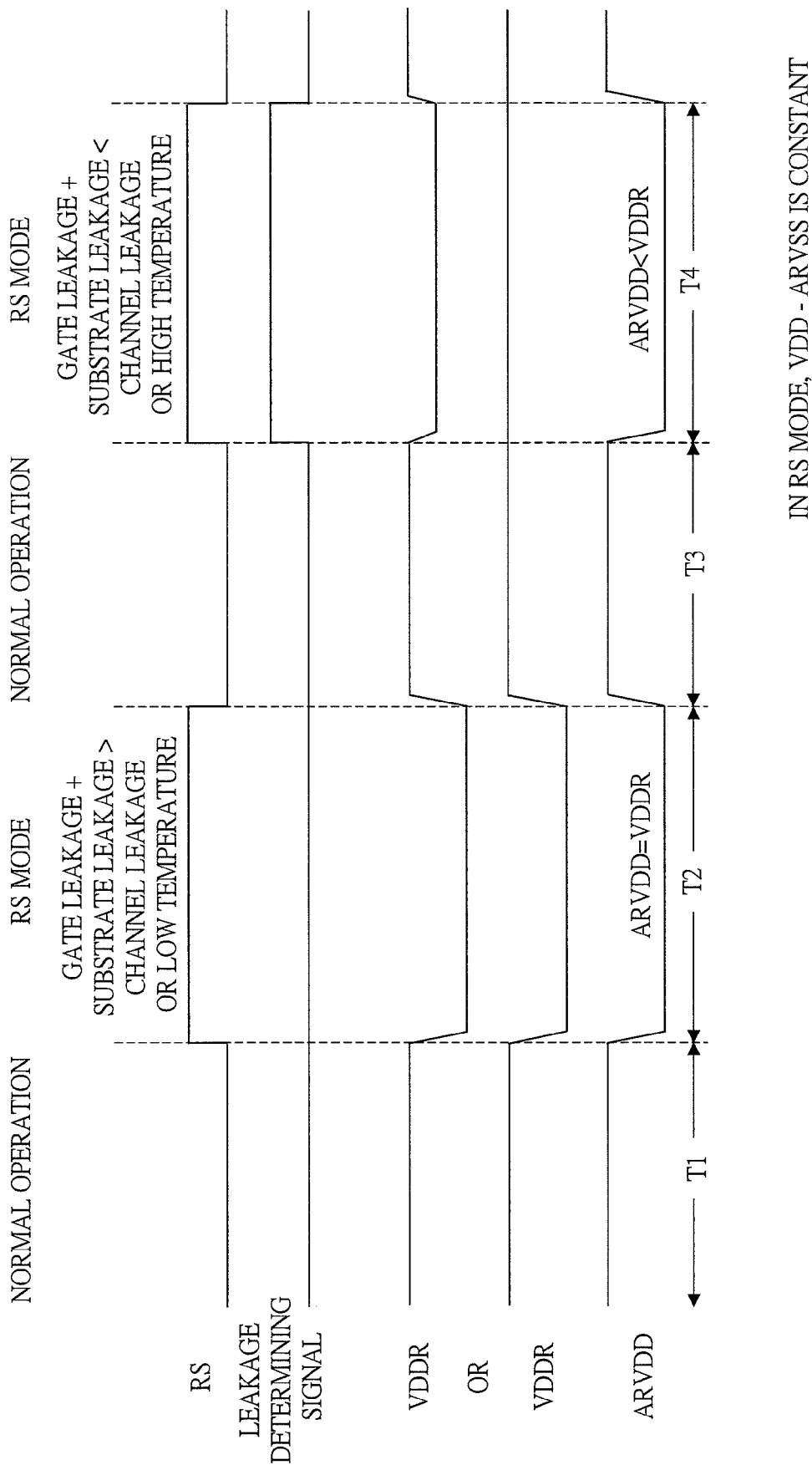
FIG. 22 is a timing chart of an example of operation in the memory array of FIG. 21.

FIG. 21 is a diagram for describing an example of memory cells provided in a memory array in an SRAM module according to a third embodiment of the present invention. FIG. 22 is a timing chart of an example of operation in the memory array of FIG. 21.

In the structure of the first embodiment, the VDDR regulator 5 and the ARVSS regulator 6 are provided, and in the structure of the second embodiment, the VSSR regulator 34 and the ARVSS regulator 6 are provided.

In the structure of the third embodiment, the VDDR regulator 5 and an ARVDD regulator 35 which generates an array power supply voltage ARVDD are provided.

FIG. 21 is a diagram for describing an example of memory cells MS provided in a memory array MA in the SRAM module 12.

To the back gates (wells in which the transistors are formed) of the transistors 17 and 19, the power supply voltage VDDR generated by the VDDR regulator 5 is coupled so that the power supply voltage VDDR is supplied via the cell power supply line.

To one input parts of the transistors 17 and 19, the array power supply voltage ARVDD generated by the ARVDD regulator 35 is coupled so that the array power supply voltage ARVDD is supplied via an array power supply line. Also, to one connection parts of the transistors 18 and 20 and the back gates (wells) of the transistors 15, 16, 18, and 20, the cell substrate power supply line is connected. The other connection structure of the memory cell MS and the connection structures of the word line driver 61 and the transistor 62 formed of an N-channel MOS are similar to those in FIG. 6.

FIG. 22 is a timing chart of an example of operation in the memory array MA of FIG. 21.

FIG. 22 shows, from above to below, signal timings of the resume standby signal RS to be outputted from the power supply control circuit 8 (FIG. 1), the leakage determining signal to be outputted from the leakage type determining circuit 7 (FIG. 1) via the leakage determining line, the power supply voltage VDDR to be outputted from the VDDR regulator 5 via the cell power supply line, and the array power supply voltage ARVDD to be outputted from the ARVDD regulator 35 via the array power supply line.

First, in FIG. 22, in a period T1 where the SRAM modules 12 are in normal operation, the resume standby signal RS is a Lo signal, and the power supply voltage VDDR and the array power supply voltage ARVDD are supplied.

Then, in a period T2 where the SRAM modules 12 make a transition from the normal operation to the resume standby mode, in the resume standby mode, the leakage type determining circuit 7 determines that the current value indicating the sum of the gate leakage and the substrate leakage of leakage current components is larger than the current value indicating the channel leakage of leakage current components, and outputs the result as the leakage determining signal of a Lo signal.

The resume standby signal RS of a Hi signal and the leakage determining signal of a Lo signal are inputted to the VDDR regulator 5 and the ARVDD regulator 35, respectively. Based on these inputted signals, the VDDR regulator 5 and the ARVDD regulator 35 generate the power supply voltage VDDR and the array power supply voltage ARVDD each having a voltage level lower than that in the normal operation (in the period T1), respectively, and supply them to the SRAM modules 12. Here, the voltage level of the power supply voltage VDDR and the voltage level of the array power supply voltage ARVDD are assumed to be approximately equal to each other.

Subsequently, in a period T4 where the SRAM modules 12 make a transition from the normal operation in the period T3 to the resume standby mode, in the resume standby mode, the leakage type determining circuit 7 determines that the current value indicating the channel leakage is larger than the current value indicating the sum of the gate leakage and the substrate leakage, and outputs the result as the leakage determining signal of a Hi signal.

The resume standby signal RS of a Hi signal and the leakage determining signal of a Hi signal are inputted to the VDDR regulator 5 and the ARVDD regulator 35, respectively. Based on these inputted signals, the VDDR regulator 5 and the ARVDD regulator 35 generate the power supply voltage VDDR and the array power supply voltage ARVDD each having a voltage level lower than that in the normal operation (in the period T3), respectively, and supply them to the SRAM modules 12.

At this time, the ARVDD regulator 35 adjusts the array power supply voltage ARVDD so that it has a voltage level lower than that of the power supply voltage VDDR.

Here, the voltage levels of the power supply voltage VDDR and the array power supply voltage ARVDD are decreased, and the voltage level of the array power supply voltage ARVDD is made lower than that of the power supply voltage VDDR. Alternatively, in the period T4, the voltage level of the power supply voltage VDDR may not be decreased and may be similar to the voltage level in the period T3.

Also here, in the period T2, by increasing the cell substrate power supply voltage VSSR and the cell source power supply voltage ARVSS, the drain-well voltage, the gate-well voltage, and the gate-drain voltage can be decreased compared with those in the period T4. In the period T4, by setting the voltage level of the cell substrate power supply voltage VSSR to be lower than that of the cell source power supply voltage ARVSS, a threshold voltage of the transistor can be increased compared with that in the period T2.

In this manner, also in the third embodiment, even if any of the leakage current components, that is, the current value indicating the channel leakage and the current value indicating the sum of the gate leakage and the substrate leakage is increased, the leakage current can be significantly reduced. Therefore, low power consumption of the semiconductor integrated circuit device 1 can be achieved.

Furthermore, also in the third embodiment, the structure is such that the ARVDD regulator 35 is provided. Alternatively, in place of providing a power supply circuit which generates a highly-accurate voltage such as the ARVDD regulator 35, a power supply circuit which generates the array power supply voltage ARVDD may be formed of, for example, a power supply circuit with a simple circuit structure using a diode connection MOS transistor or the like, and this power supply circuit may be provided in each of the SRAM modules 12 of the regions 2 to 4.

Fourth Embodiment

Figure 23:
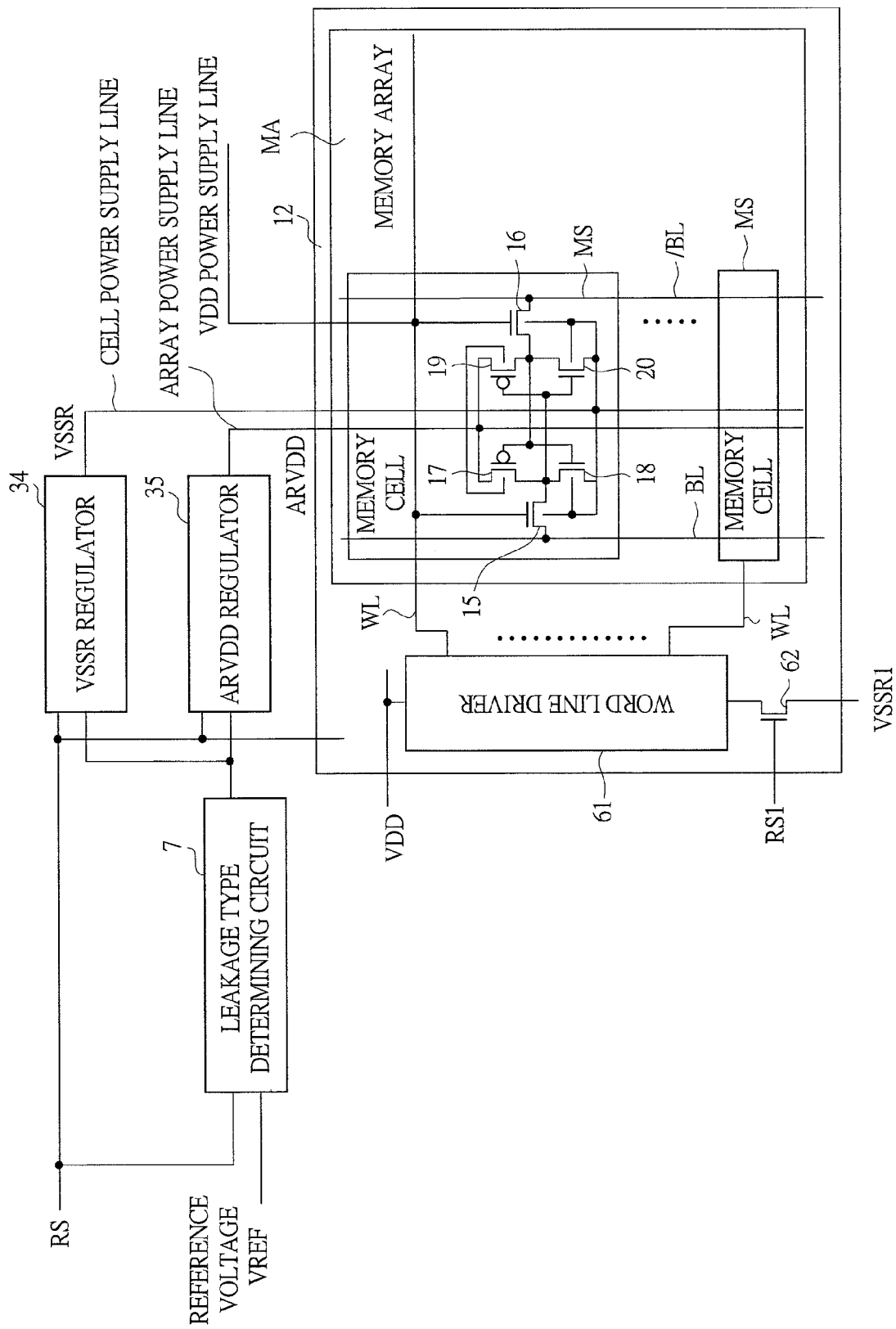
FIG. 23 is a diagram for describing an example of memory cells provided in a memory array in an SRAM module according to a fourth embodiment of the present invention.
Figure 24:
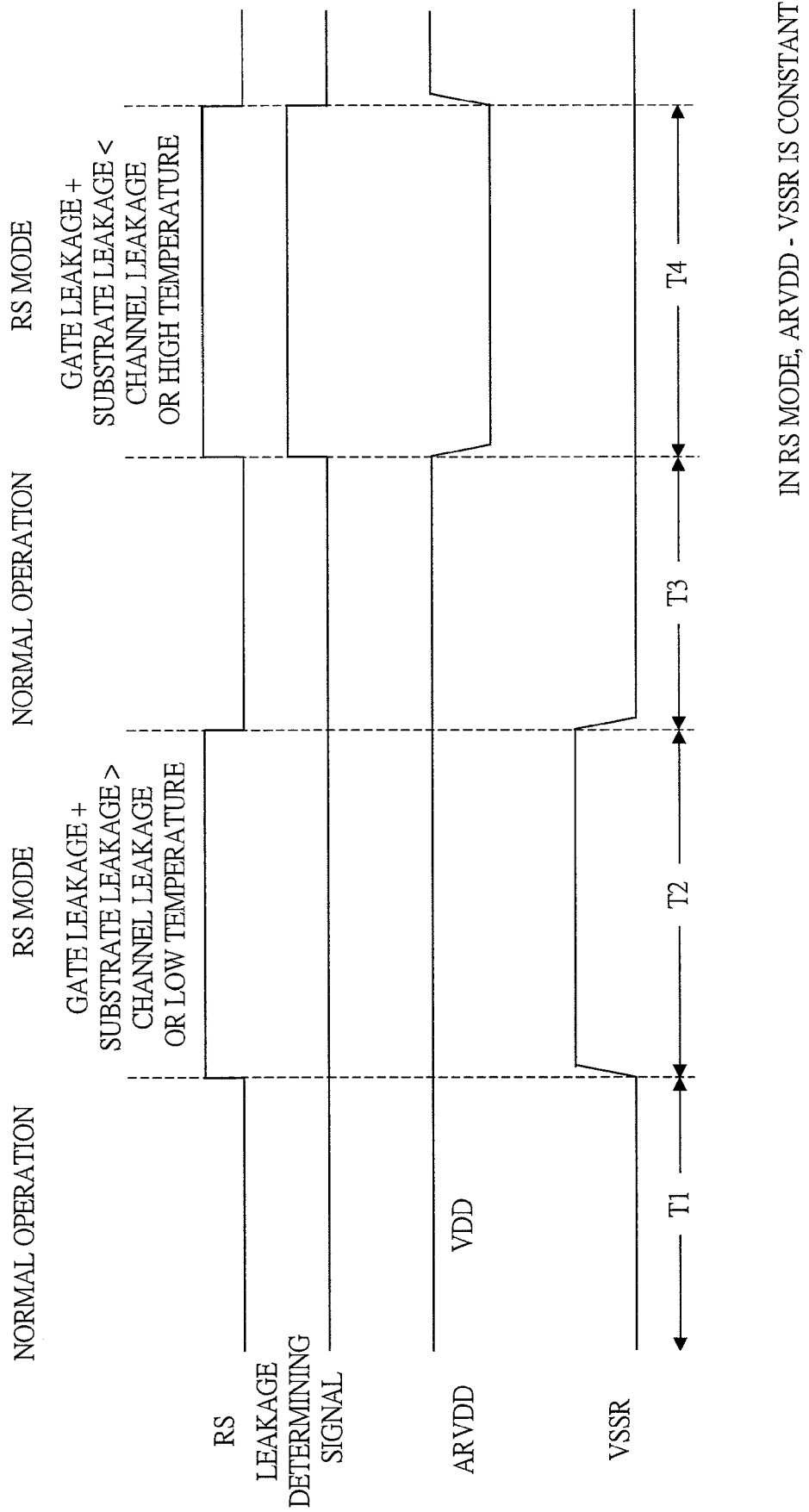
FIG. 24 is a timing chart of an example of operation in the memory array of FIG. 23.
Figure 25:
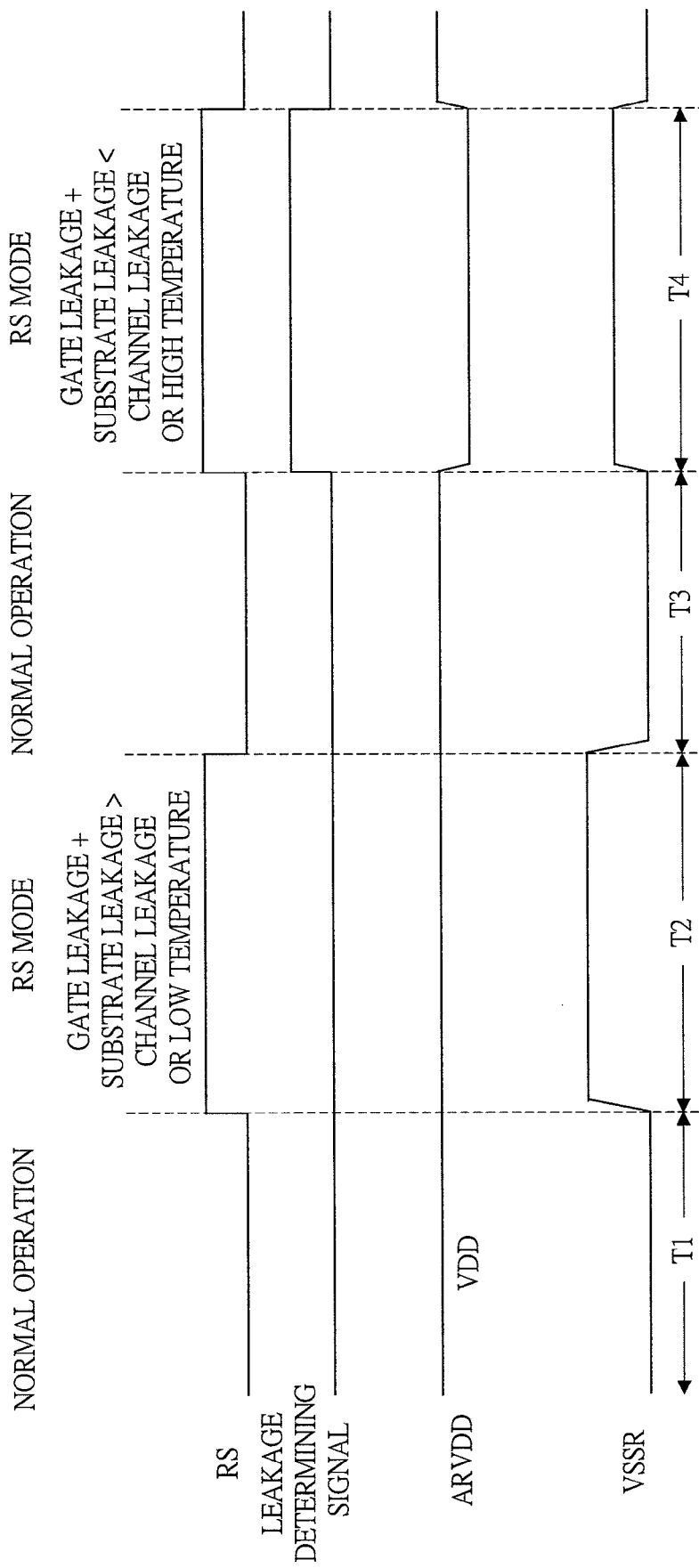
FIG. 25 is a timing chart of another example of FIG. 24.

FIG. 23 is a diagram for describing an example of memory cells provided in a memory array in an SRAM module according to a fourth embodiment of the present invention. FIG. 24 is a timing chart of an example of operation in the memory array of FIG. 23. FIG. 25 is a timing chart of another example of FIG. 24.

In the fourth embodiment, in place of the VDDR regulator 5 of the third embodiment, the VSSR regulator 34 is provided.

FIG. 23 is a diagram for describing an example of the memory cells MS provided in the memory array MA included in the SRAM module 12.

To one connection parts of the transistors 17 and 19, the array power supply voltage ARVDD generated by the ARVDD regulator 35 is coupled so that the array power supply voltage ARVDD is supplied via the array power supply line, and to the other connection parts of the transistors 18 and 20 and the back gates (wells where the transistors are formed) of the transistors 15, 16, 18, and 20, the cell substrate power supply voltage VSSR generated by the VSSR regulator 34 is coupled so that the cell substrate power supply voltage VSSR is supplied via the cell substrate power supply line. Also, to the back gates of the transistors 17 and 19, the power supply voltage VDD is coupled so that the power supply voltage VDD is supplied.

The other connection structure of the memory cell MS and the connection structure of the word line driver 61 and the transistor 62 formed of an N-channel MOS are similar to those of FIG. 6.

FIG. 24 is a timing chart of an example of operation in the memory array MA of FIG. 23.

FIG. 24 shows, from above to below, signal timings of the resume standby signal RS to be outputted from the power supply control circuit 8 (FIG. 1) via the resume line, the leakage determining signal to be outputted from the leakage type determining circuit 7 (FIG. 1) via the leakage determining line, the array power supply voltage ARVDD to be outputted from the ARVDD regulator 35 via the array power supply line, and the cell substrate power supply voltage VSSR to be outputted from the VSSR regulator 34 via the cell substrate power supply line.

First, in FIG. 24, in a period T1 where the SRAM modules 12 are in normal operation, the resume standby signal RS is a Lo signal. In a period T2 where the SRAM modules 12 make a transition from the normal operation to the resume standby mode, the leakage type determining circuit 7 determines whether the current value indicating the sum of the gate leakage and the substrate leakage of leakage current components is larger than the current value indicating the channel leakage of leakage current components. When the leakage type determining circuit 7 determines that the current value indicating the sum of the gate leakage and the substrate leakage is larger than the current value indicating the channel leakage, it outputs the result as the leakage determining signal of a Lo signal via the leakage determining line.

In response to this, the VSSR regulator 34 outputs the cell substrate power supply voltage VSSR having a voltage level higher than that of the reference voltage VSS to the SRAM modules 12 via the cell substrate power supply line.

Also, in a period T4 where the SRAM modules 12 make a transition from the normal operation in a period T3 to the resume standby mode, in the resume standby mode, the leakage type determining circuit 7 determines whether the current value indicating the channel leakage is larger than the current value indicating the sum of the gate leakage and the substrate leakage.

When the leakage type determining circuit 7 determines that the current value indicating the channel leakage is larger than the current value indicating the sum of the gate leakage and the substrate leakage, the leakage type determining circuit 7 outputs the result as the leakage determining signal of a Hi signal from the leakage determining line.

In response to this, the ARVDD regulator 35 generates the array power supply voltage ARVDD so that its voltage level is lower than that in the normal operation, and supplies the voltage to the SRAM modules 12 via the array power supply line.

FIG. 25 is a timing chart of another example of FIG. 24.

In this case, periods T1 to T3 are similar to those in FIG. 24. However, in a period T4 where the SRAM modules 12 make a transition from the normal operation in the period T3 to the resume standby mode, the ARVDD regulator 35 generates the array power supply voltage ARVDD so that its voltage level is lower than that of the power supply voltage VDD, and supplies the voltage to the SRAM modules 12 via the array power supply line. Also, the VSSR regulator 34 generates the cell substrate power supply voltage VSSR having a voltage level higher than that of the reference voltage VSS, and supplies the voltage to the SRAM modules 12 via the cell substrate power supply line.

Also here, in the resume standby mode, a relation between the array power supply voltage ARVDD and the cell substrate power supply voltage VSSR is assumed to satisfy the condition of "array power supply voltage ARVDD−cell substrate power supply voltage VSSR=constant".

In this manner, by adjusting the voltage levels of the array power supply voltage ARVDD and the cell substrate power supply voltage VSSR in accordance with the type of leakage components, the leakage current of the memory cell MS can be reduced.

By this means, also in the fourth embodiment, even if any of the leakage current components, that is, the current value indicating the channel leakage and the current value indicating the sum of the gate leakage and the substrate leakage is increased, the leakage current can be significantly reduced. Therefore, low power consumption of the semiconductor integrated circuit device 1 can be achieved.

Furthermore, also in the fourth embodiment, the structure is such that the ARVDD regulator 35 is provided. Alternatively, in place of providing a power supply circuit which generates a highly-accurate voltage such as the ARVDD regulator 35, for example, a power supply circuit with a simple circuit structure using a diode connection MOS transistor or the like and generating the array power supply voltage ARVDD may be provided in each of the SRAM modules 12 of the regions 2 to 4.

Fifth Embodiment

Figure 26:
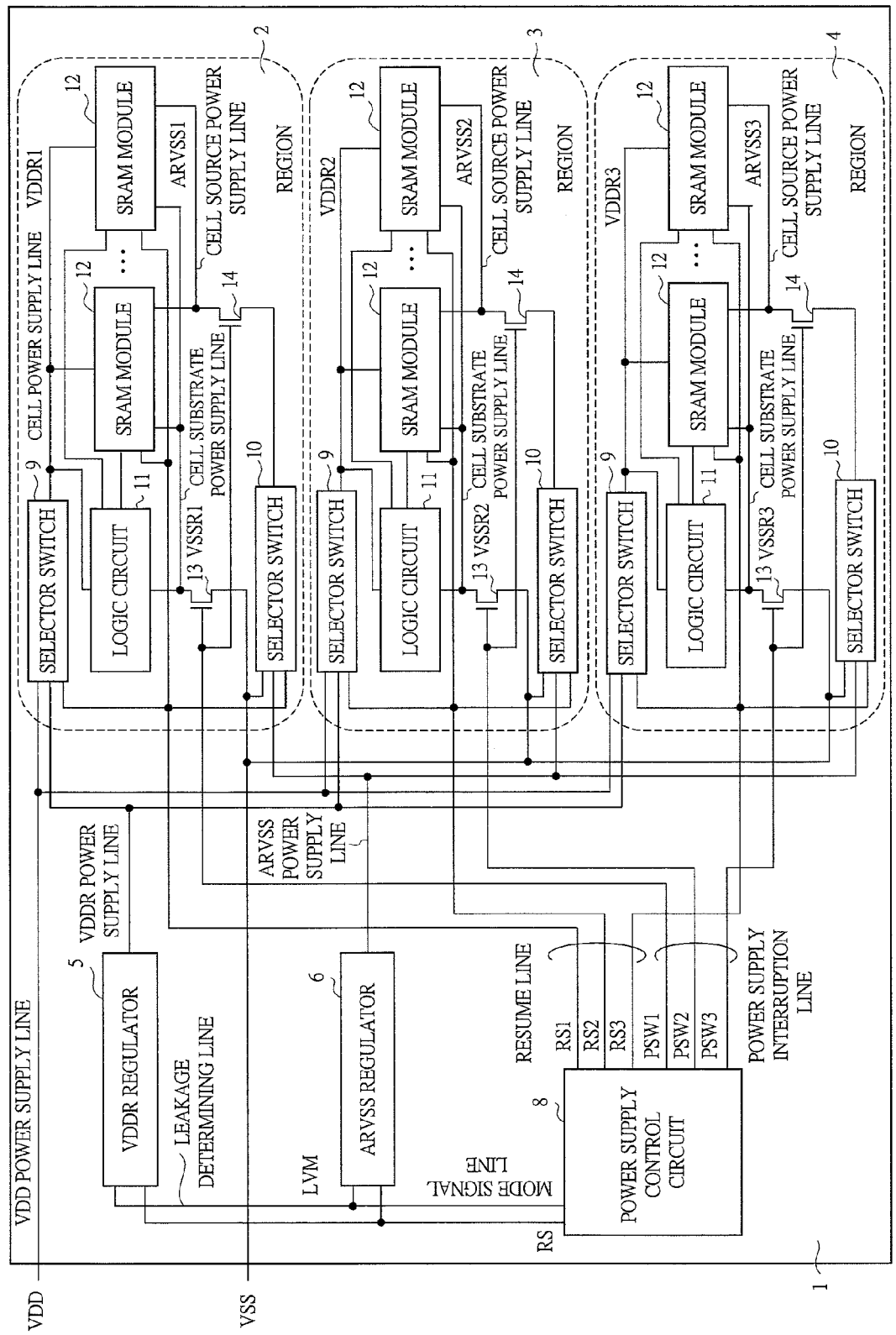
FIG. 26 is a block diagram of an example of a semiconductor integrated circuit device according to a fifth embodiment of the present invention.
Figure 27:
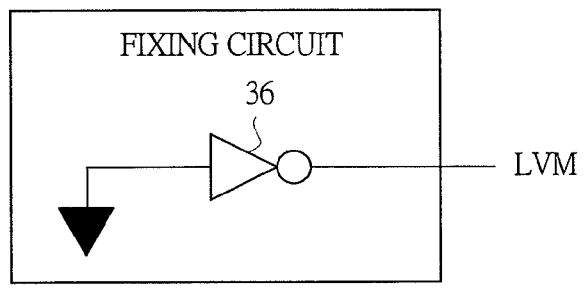
FIG. 27 is a circuit diagram of an example of a signal fixing circuit provided in a power supply control circuit and outputting a low-voltage mode signal in the semiconductor integrated circuit device of FIG. 26.
Figure 28:
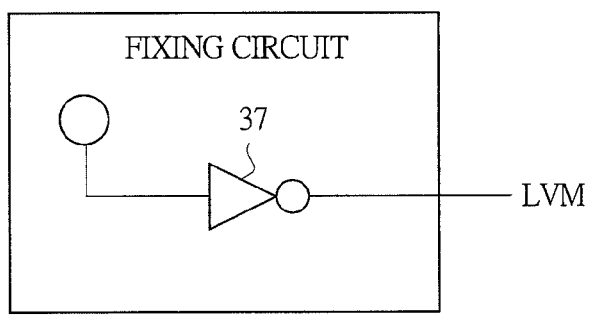
FIG. 28 is a circuit diagram of another example of the signal fixing circuit provided in the power supply control circuit and outputting a low-voltage mode signal in the semiconductor integrated circuit device of FIG. 26.
Figure 29:
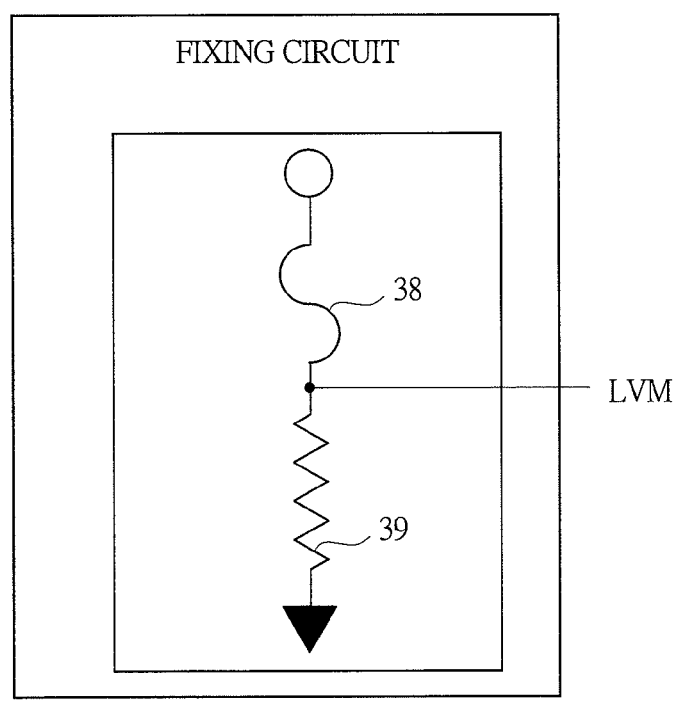
FIG. 29 is a circuit diagram of still another example of the signal fixing circuit provided in the power supply control circuit and outputting a low-voltage mode signal in the semiconductor integrated circuit device of FIG. 26.

FIG. 26 is a block diagram of an example of a semiconductor integrated circuit device according to a fifth embodiment of the present invention. FIG. 27 is a circuit diagram of an example of a signal fixing circuit provided in a power supply control circuit and outputting a low-voltage mode signal in the semiconductor integrated circuit device of FIG. 26. FIG. 28 is a circuit diagram of another example of the signal fixing circuit provided in the power supply control circuit and outputting a low-voltage mode signal in the semiconductor integrated circuit device of FIG. 26. FIG. 29 is a circuit diagram of still another example of the signal fixing circuit provided in the power supply control circuit and outputting a low-voltage mode signal in the semiconductor integrated circuit device of FIG. 26.

In the fifth embodiment, the semiconductor integrated circuit device 1 includes, as shown in FIG. 26, the regions 2 to 4, the VDDR regulator 5, the ARVSS regulator 6, the power supply control circuit 8, and others, and the leakage type determining circuit 7 in FIG. 1 of the first embodiment is deleted.

Furthermore, the power supply control circuit 8 is connected so that a low-voltage mode signal LVM is outputted to the VDDR regulator 5 and the ARVSS regulator 6 via a mode signal line. This low-voltage mode signal LVM is a signal fixed in advance to either one of a Hi signal and a Lo signal, and is outputted as a leakage determining signal to the VDDR regulator 5 and the ARVSS regulator 6. The other connection structure is similar to that of FIG. 1.

FIG. 27 to FIG. 29 are diagrams each showing an example of a signal fixing circuit provided in the power supply control circuit 8 and outputting a low-voltage mode signal LVM.

In FIG. 27, the signal fixing circuit includes an inverter 36. In FIG. 28, the signal fixing circuit includes an inverter 37. In FIG. 27, an input part of the inverter 36 is coupled to the reference voltage VSS, and the low-voltage mode signal LVM of a Hi signal is outputted from an output part.

In FIG. 28, the power supply voltage VDD is supplied to an input part of the inverter 37, and the low-voltage mode signal LVM of a Lo signal is outputted from an output part.

In FIG. 29, the signal fixing circuit includes a fuse 38 and a resistor 39. To one connection part of the fuse 38, the power supply voltage VDD is coupled, and to the other connection part of the fuse 38, one contact part of the resistor 39 is connected.

To the other connection part of the resistor 39, the reference voltage VSS is coupled, and a connection part between the fuse 38 and the resistor 39 serves as an output part of the low-voltage mode signal LVM.

For example, when the low-voltage mode signal LVM of a Hi signal is outputted to the mode signal line, the fuse 38 is not cut off, and when the low-voltage mode signal LVM of a Lo signal is outputted to the mode signal line, the fuse 38 is cut off to output the fixed signal.

Also in this case, in the resume standby mode, when the channel leakage is desired to be reduced, for example, the low-voltage mode signal LVM is fixed to a Hi signal in advance, and when the gate leakage and the substrate leakage are desired to be reduced, the low-voltage mode signal LVM is fixed to a Lo signal in advance.

In this case, the use of the low-voltage mode signal LVM whose signal level is fixed in advance is effective when use conditions and others of the semiconductor integrated circuit device can be predicted in advance, leakage components of the memory cell MS are known (whether the channel leakage is large or the gate leakage and the substrate leakage are large), and the leakage components are not changed.

Sixth Embodiment

Figure 30:
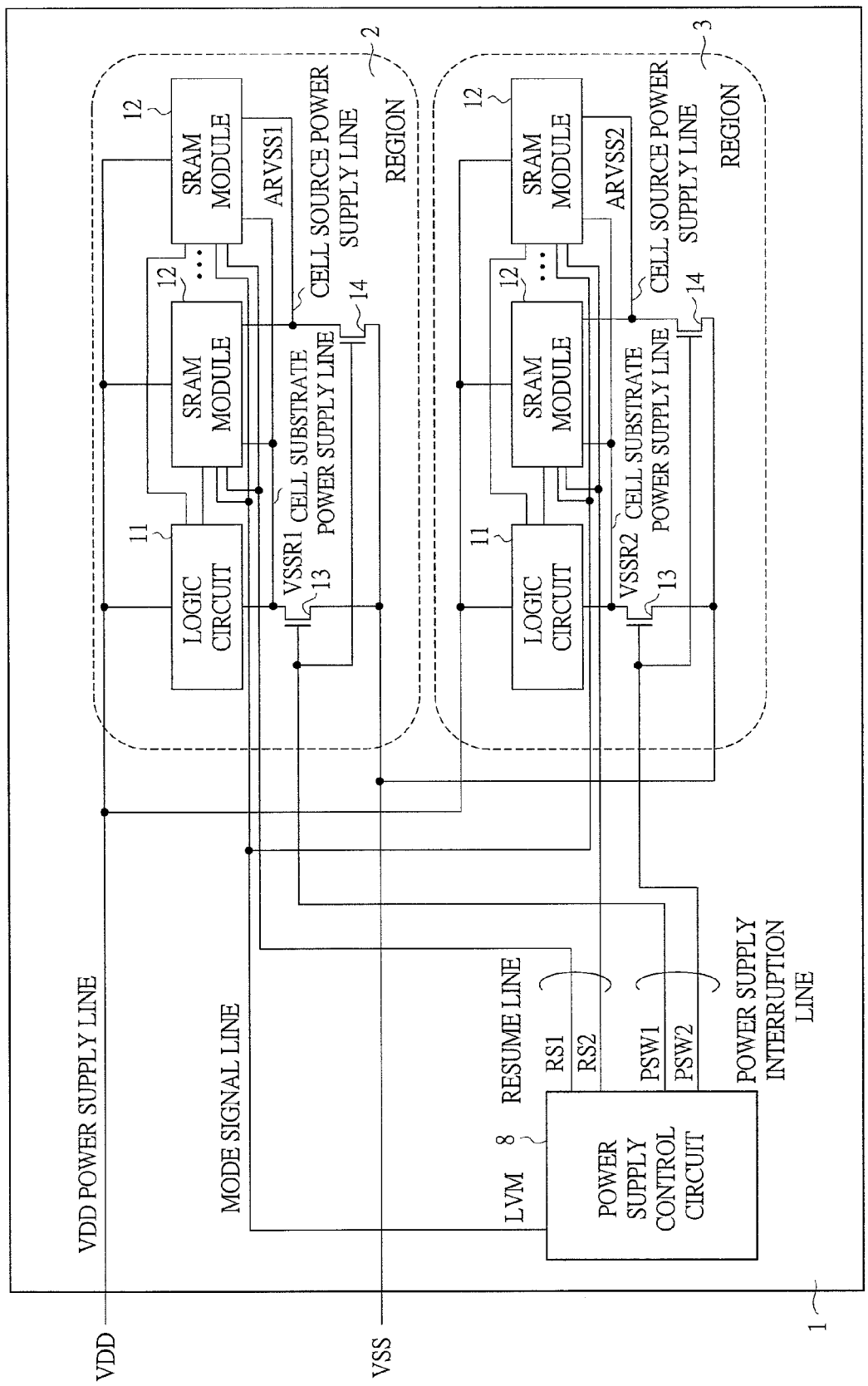
FIG. 30 is a block diagram of an example of a semiconductor integrated circuit device according to a sixth embodiment of the present invention.

FIG. 30 is a block diagram of an example of a semiconductor integrated circuit device according to a sixth embodiment of the present invention.

In the sixth embodiment, the semiconductor integrated circuit device 1 includes, as shown in FIG. 30, the regions 2 and 3 and the power supply control circuit 8. A difference from the fifth embodiment shown in FIG. 26 is that the region 4 and the VDDR regulator 5 and the ARVSS regulator 6 common to each region are deleted.

However, although not shown, an ARVSS regulator is provided in each SRAM module of each region.

Also, in this structure, when the region 2 or the region 3 turns to the resume standby mode, the externally-inputted power supply voltage VDD is controlled so that the voltage level of the power supply voltage VDD is decreased outside and is then inputted.

Furthermore, the low-voltage mode signal LVM is outputted from the power supply control circuit 8 to the SRAM modules 12 via the mode signal line. As with the fifth embodiment, this low-voltage mode signal LVM is a signal arbitrarily fixed to any one of a Hi signal and a Lo signal in advance. In this manner, an output of the ARVSS regulator is determined.

Seventh Embodiment

Figure 31:
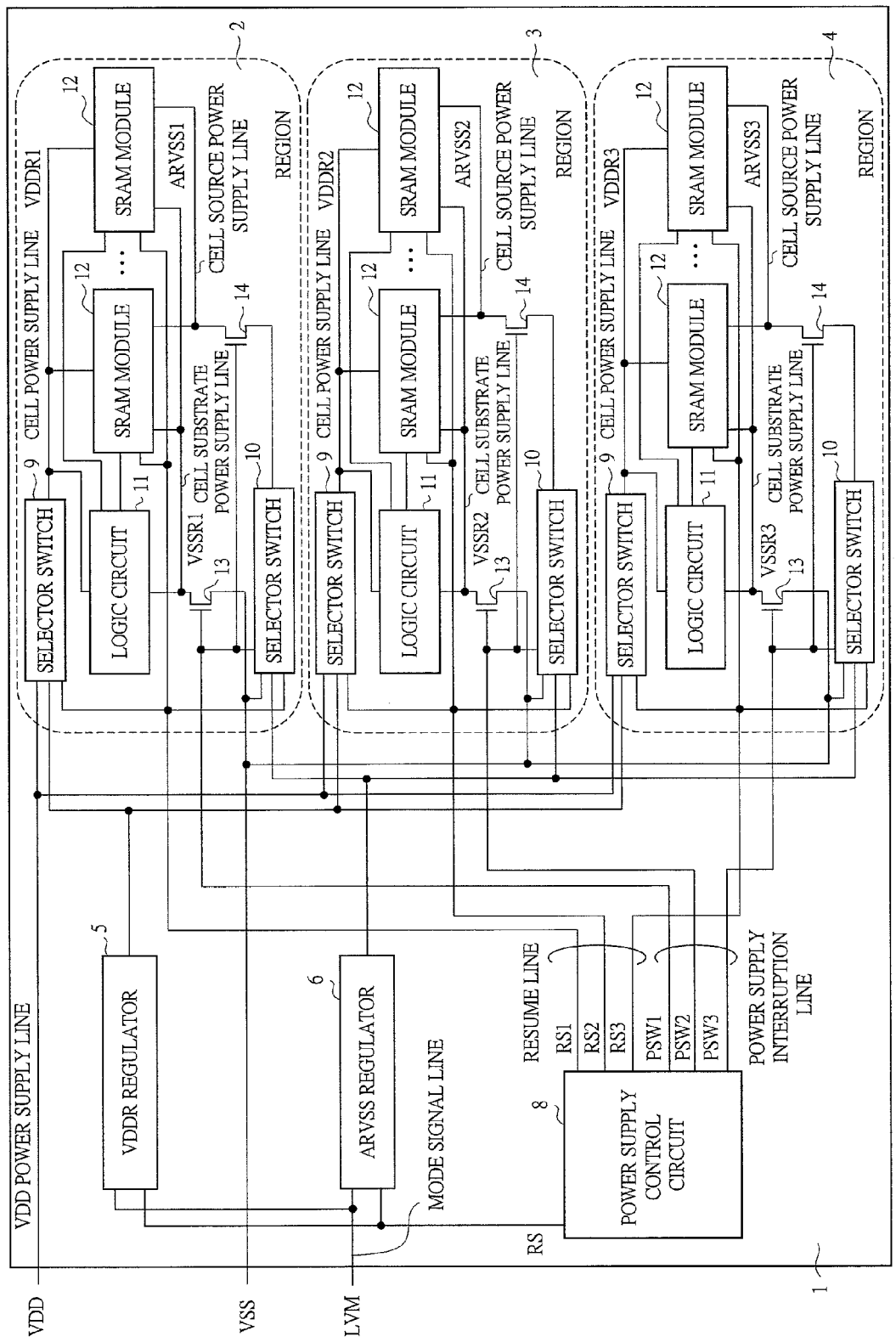
FIG. 31 is a block diagram of an example of a semiconductor integrated circuit device according to a seventh embodiment of the present invention.

FIG. 31 is a block diagram of an example of a semiconductor integrated circuit device according to a seventh embodiment of the present invention.

In the seventh embodiment, the semiconductor integrated circuit device 1 includes, as shown in FIG. 31, the regions 2 to 4, the VDDR regulator 5, the ARVSS regulator 6, and the power supply control circuit 8. A difference from the fifth embodiment shown in FIG. 26 is that the low-voltage mode signal LVM is inputted from outside of the semiconductor integrated circuit device 1 to the VDDR regulator 5 and the ARVSS regulator 6.

Also in this case, the low-voltage mode signal LVM inputted from outside of the semiconductor integrated circuit device 1 via the mode signal line is a signal fixed to any one of a Hi signal and a Lo signal in advance. The other connection structure and operation are similar to those of FIG. 26.

Also in this case, in the resume standby mode, when the channel leakage is desired to be reduced, for example, the low-voltage mode signal LVM of a Hi signal is inputted from outside, and when the gate leakage and the substrate leakage are desired to be reduced, the low-voltage mode signal LVM of a Lo signal is inputted from outside.

Eighth Embodiment

Figure 32:
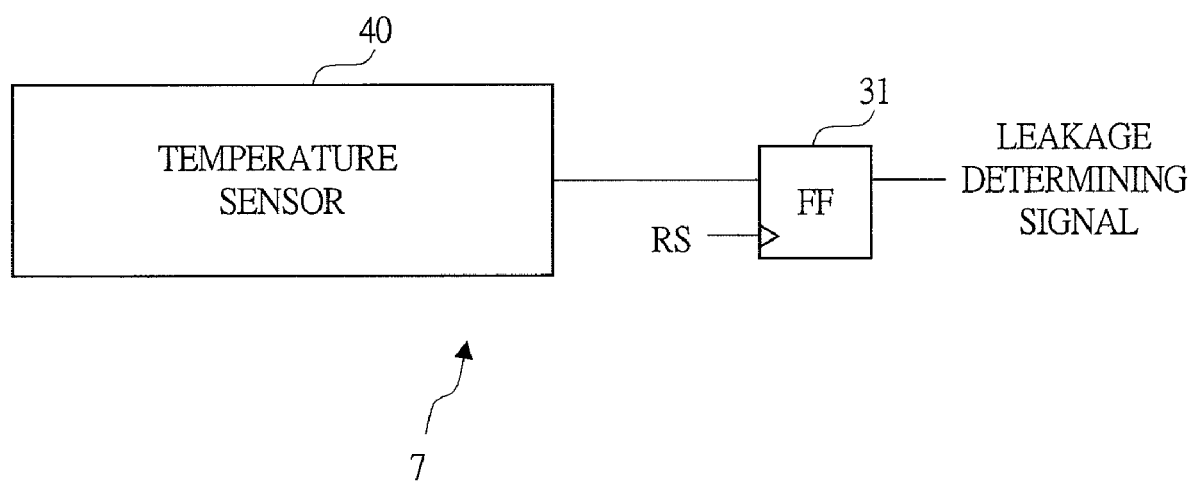
FIG. 32 is a block diagram of an example of a structure of a leakage type determining circuit according to an eighth embodiment of the present invention.
Figure 33:
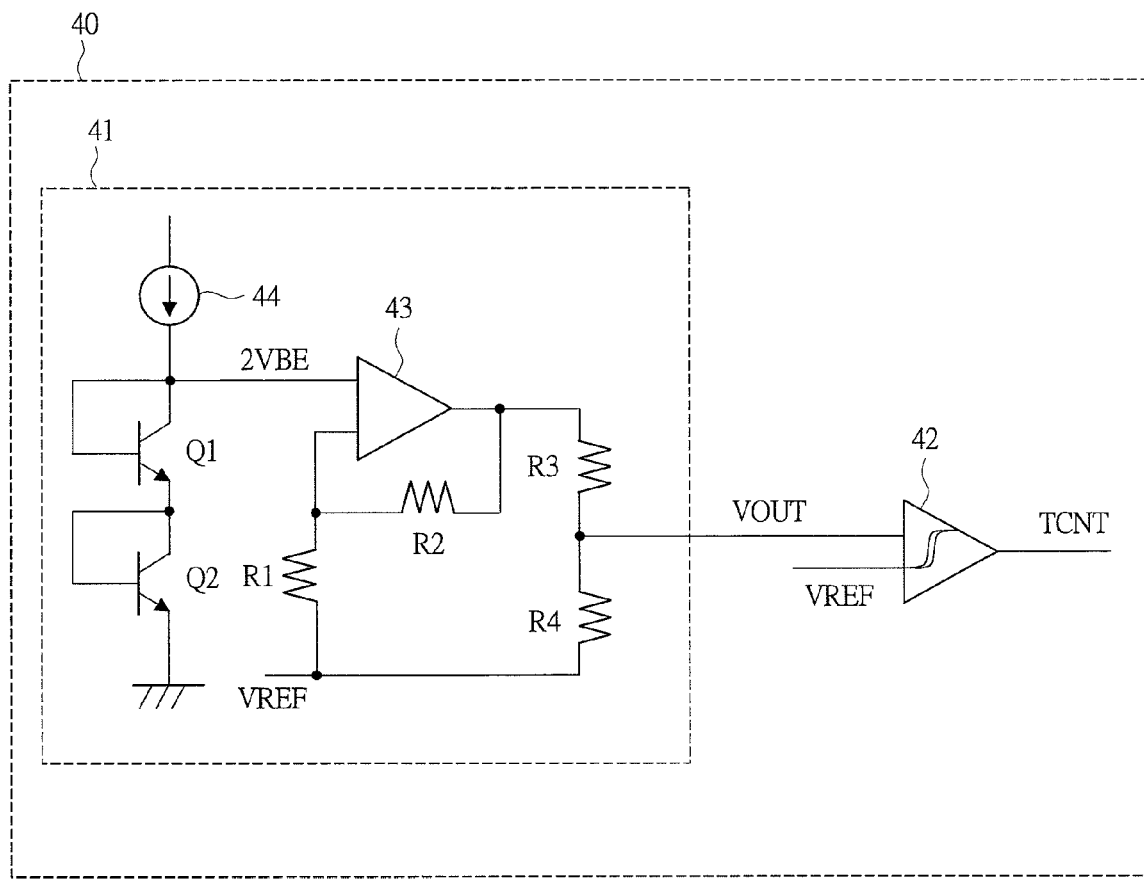
FIG. 33 is a diagram for describing an example of a temperature sensor provided in the leakage type determining circuit of FIG. 32.

FIG. 32 is a block diagram of an example of a structure of a leakage type determining circuit according to an eighth embodiment of the present invention. FIG. 33 is a diagram for describing an example of a temperature sensor provided in the leakage type determining circuit of FIG. 32.

In the eighth embodiment, for example, a leakage type determining circuit 7 has a structure in which the leakage type is determined based on temperature as shown in FIG. 32. In this case, the leakage type determining circuit 7 includes a temperature sensor 40 and the flip-flop 31.

To an input terminal of the flip-flop 31, a signal outputted from the temperature sensor 40 is coupled so as to be inputted, and to a clock terminal of the flip-flop 31, the resume standby signal RS is coupled so as to be inputted. Also, a signal outputted from an output terminal of the flip-flop 31 is a leakage determining signal.

The temperature sensor 40 includes, as shown in FIG. 33, a temperature sensor unit 41 and a Schmitt trigger circuit 42 serving as a determining unit. The temperature sensor unit 41 includes a differential amplifier 43, a current source 44, bipolar transistors Q1 and Q2, and resistors R1 to R4.

By amplifying VBE voltages of two stages of the bipolar transistors Q1 and Q2 by the differential amplifier 43, the temperature sensor unit 41 can provide a temperature gradient in which the output voltage VOUT is high at low temperature and is low at high temperature. The gradient of the output voltage VOUT and the temperature at which the output voltage VOUT crosses the reference voltage VREF can be achieved by appropriately setting the values of the resistors R1 to R4.

In consideration of noise tolerance, as an output (signal TCNT) from the temperature sensor 40, it is convenient to convert an analog signal such as the output voltage VOUT to a digital signal level. Therefore, the output voltage VOUT at an analog level is converted to the digital signal TCNT by the Schmitt trigger circuit 42.

The Schmitt trigger circuit 42 for use has a hysteresis characteristic in which a threshold temperature at which the digital signal TCNT is changed from a Lo signal to a Hi signal when temperature is changed from low to high is T2 and a threshold temperature at which the digital signal TCNT is changed from a Hi signal to a Lo signal when temperature is changed from high to low is T1.

This is intended to prevent an increase in power consumption and noise due to frequent switching of the signal TCNT between a Hi signal and a Lo signal when the temperature is around the determination level.

In the control of the leakage type determining circuit 7 in this case, as shown in FIG. 7, for example, when the temperature sensor 40 determines it is low temperature, a leakage determining signal which determines that the current value indicating the sum of the gate leakage and the substrate leakage is larger is outputted, and when the temperature sensor 40 determines it is high temperature, a leakage determining signal which determines that the current value indicating the channel leakage is larger is outputted.

Ninth Embodiment

Figure 36:
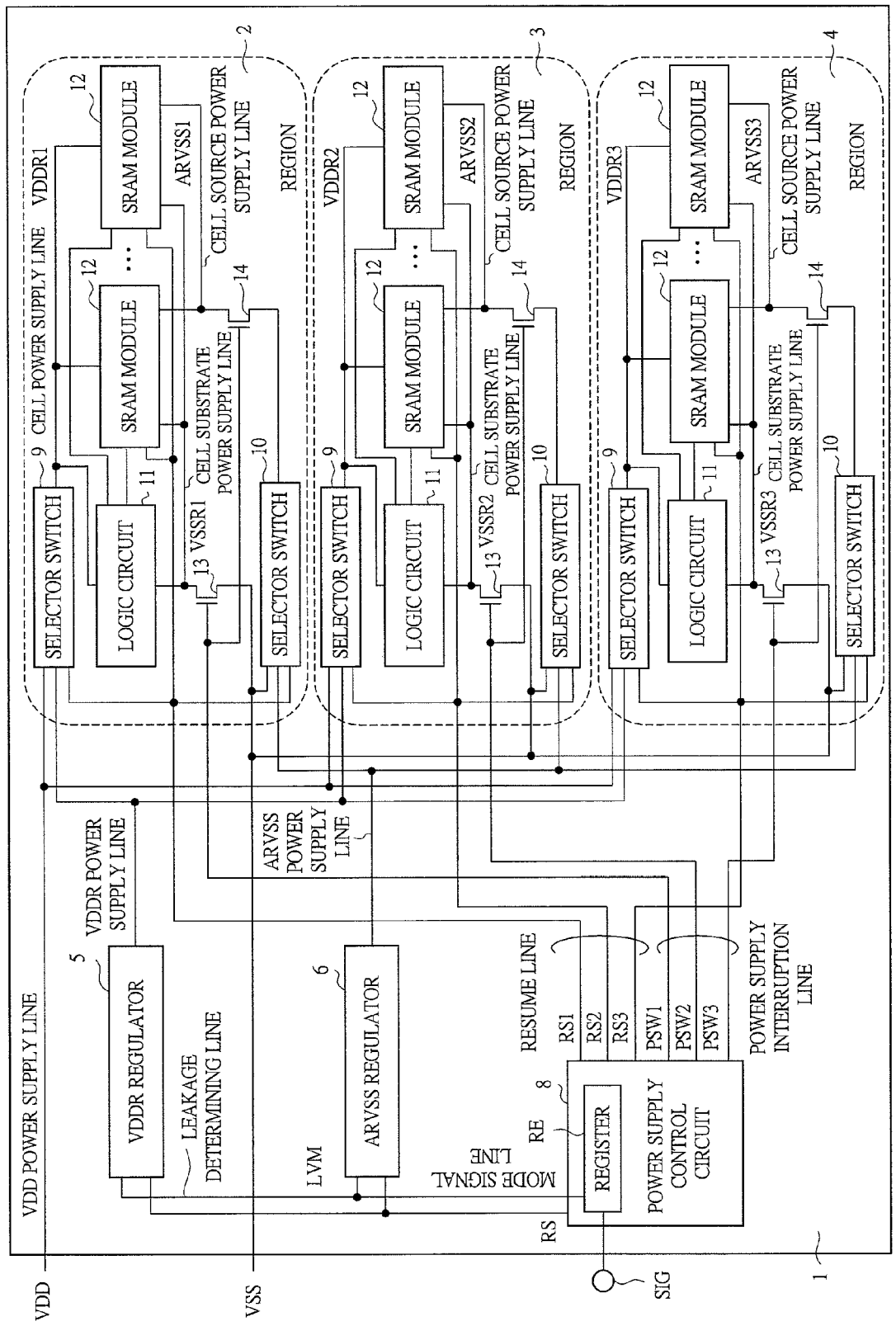
FIG. 36 is a block diagram of an example of a semiconductor integrated circuit device according to a ninth embodiment of the present invention.

FIG. 36 is a block diagram of an example of a semiconductor integrated circuit device according to a ninth embodiment of the present invention.

In the fifth embodiment, the low-voltage mode signal LVM is set by using the signal fixing circuit as shown in FIG. 27 to FIG. 29. In the ninth embodiment, a register RE is used as shown in FIG. 36.

The register RE is connected to a terminal SIG provided as an external terminal of the semiconductor integrated circuit device 1. A signal is given from outside of the semiconductor integrated circuit device 1, and data corresponding to that signal is retained in the register RE. Based on this data, a signal is outputted from the register RE via a mode signal line, thereby setting the low-voltage mode signal LVM to the VDDR regulator 5 and the ARVSS regulator 6.

By this means, compared with the case of using a non-volatile signal fixing circuit like in the fifth embodiment, a change can be made more easily by using the register even after incorporation into a system or other situations. For example, when the semiconductor integrated circuit device 1 is used at room temperature, since the channel leakage is not large as shown in FIG. 16, setting is made from the terminal SIG so as to suppress the substrate leakage.

On the other hand, when the semiconductor integrated circuit device 1 is used at high temperatures, for example, 80° C. or higher, since the channel leakage is increased, the value of the register is set from the terminal SIG so as to suppress the channel leakage.

In this manner, by using the register RE, depending on the use environment of the semiconductor integrated circuit device 1 which is temperature in this case, switching can be made from outside so that the leakage current of the SRAM module 12 in the semiconductor integrated circuit device 1 is suppressed.

In the foregoing, the invention made by the inventor of the present invention has been concretely described based on the embodiments. However, it is needless to say that the present invention is not limited to the foregoing embodiments and various modifications and alterations can be made within the scope of the present invention.

Figure 34:
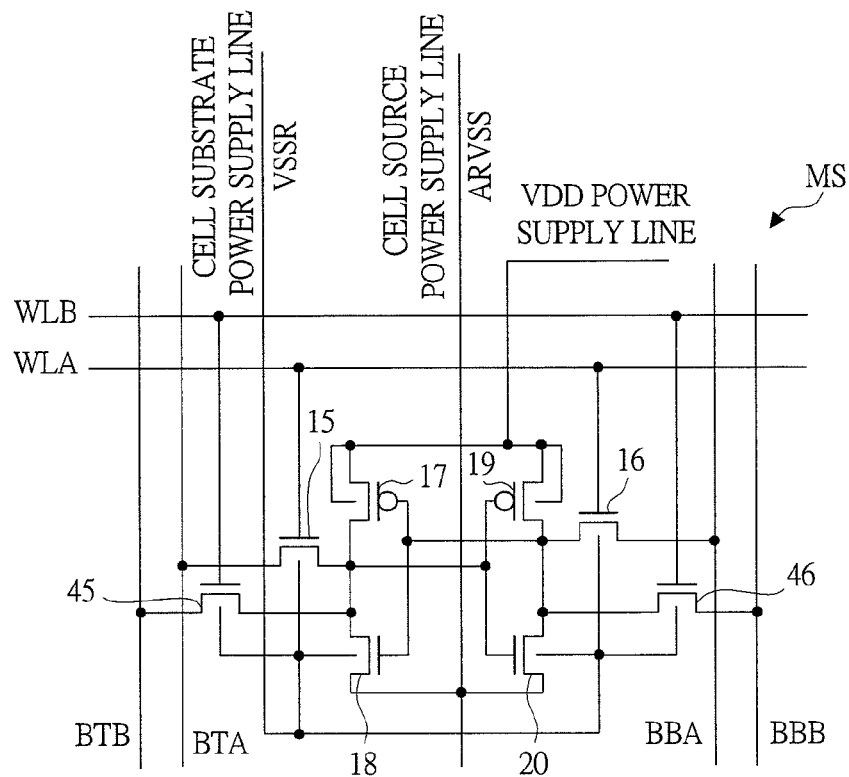
FIG. 34 is a diagram for describing an example of a memory cell provided in an SRAM module according to another embodiment of the present invention.
Figure 35:
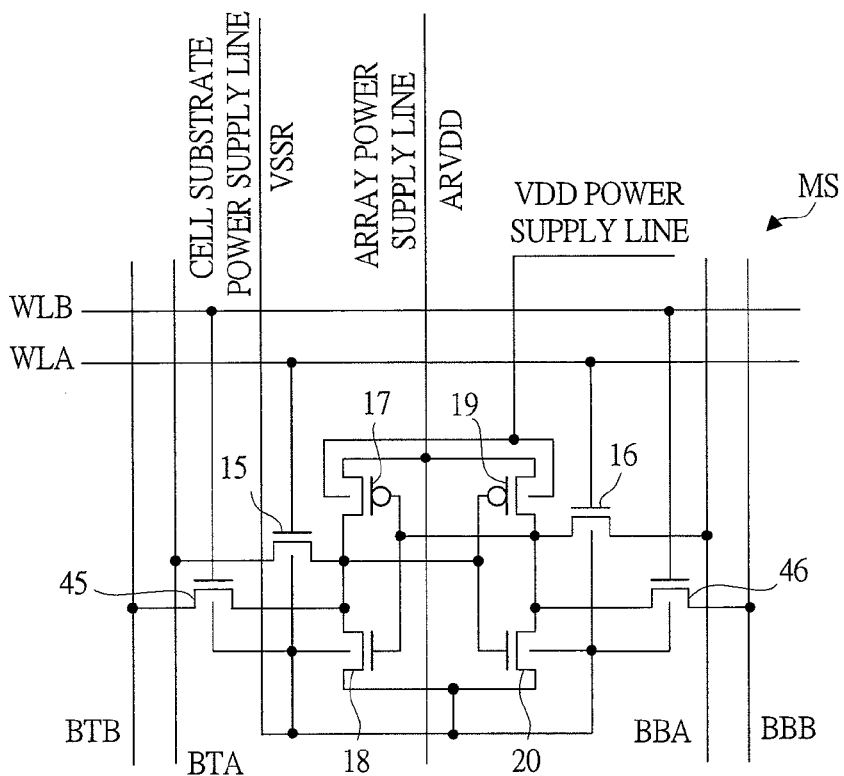
FIG. 35 is a diagram for describing another example of a memory cell provided in an SRAM module according to another embodiment of the present invention.

For example, while each memory cell MS in the SRAM module 12 is made up of a single-port memory cell in the first to sixth embodiments, the memory cell MS may be a dual-port memory cell as shown in FIG. 34 and FIG. 35.

In FIG. 34, a memory cell MS includes transistors 15 to 20, 45, and 46. The transistors 15, 16, 18, 20, 45, and 46 are each formed of an N-channel MOS (Metal Oxide Semiconductor), and the transistors 17 and 19 are each formed of a P-channel MOS.

Also, the transistors 17 and 18 and the transistors 19 and 20 each have an inverter structure. To one connection parts of the transistors 17 and 19, a power supply voltage VDD is supplied via the VDD power supply line. To the gates of the transistors 15 and 16, a word line WLA is connected, and to the gates of the transistors 45 and 46, a word line WLB is connected.

To one connection parts of the transistors 15 and 45, true bit lines BTA and BTB are connected, respectively, and to one connection parts of the transistors 16 and 46, bar bit lines BBA and BBB are connected, respectively.

Furthermore, to the other connection parts of the transistors 15 and 45, the other connection parts of the transistors 17 and 18 are connected. Still further, the other connection part of the transistor 15 is also connected to the gates of the transistors 19 and 20.

To the other connection parts of the transistors 16 and 46, a connection part between the transistors 19 and 20 is connected, and the other connection part of the transistor 16 is also connected to the gates of the transistors 17 and 18.

To the other connection parts of the transistors 18 and 20, a cell source power supply voltage ARVSS is coupled so as to be supplied via a cell source power supply line, and to the back gates of the transistors 15, 16, 45, and 46, a cell substrate power supply voltage VSSR is supplied via a cell substrate power supply line.

Furthermore, as with FIG. 34, the memory cell MS in FIG. 35 includes the transistors 15 to 20, 45, and 46. What is different from FIG. 34 is that an array power supply voltage ARVDD is supplied via an array power supply line to one connection parts of the transistors 17 and 19, a substrate voltage VSSR is supplied via a cell substrate power supply line to the other connection parts (sources) of the transistors 18 and 20 and the back gates of the transistors 45 and 46, and a power supply voltage VDD is supplied via the VDD power supply line to the back gates of the transistors 17 and 19. The other connection structure is similar to that of FIG. 34.

In the above embodiments, an example in which a region is divided into a plurality of regions has been described. However, the number of regions can be arbitrarily changed and it may be one. Also, only an SRAM module may be provided in the region. Furthermore, the number of SRAM modules in the region can be arbitrarily changed, and it may be one.

Also, examples of the semiconductor integrated circuit device include an SOC (System-On-Chip), a microcomputer, and a microprocessor, and it may be a single memory formed of an SRAM.

The present invention is suitable for a technology of reducing current consumption in a semiconductor integrated circuit device having a volatile memory cell such as an SRAM.

What is claimed is:

1. A semiconductor integrated circuit device comprising: a static memory with a normal operation state and a standby state of retaining data of a memory cell,
   wherein the static memory has a plurality of memory cells arranged in a matrix,
   the memory cells each include an inverter made up of an N-type MOS transistor and a P-type MOS transistor,
   a cell power supply voltage line for giving a power supply voltage to the P-type MOS transistor and a cell source voltage line for giving a source voltage to the N-type MOS transistor are provided,
   the static memory in the standby state is able to be set in any of a first state and a second state, and the cell power supply voltage line in both of the first state and the second state has a voltage lower than a voltage in the normal operation state, and
   the cell power supply voltage line and the cell source voltage line in the first state have voltages lower than voltages thereof in the second state.

2. A semiconductor integrated circuit device comprising: a static memory with a normal operation state and a standby state of retaining data of a memory cell,
   wherein the static memory has a plurality of memory cells arranged in a matrix,
   the memory cells each include an inverter made up of an N-type MOS transistor and a P-type MOS transistor,
   a cell power supply voltage line for giving a power supply voltage to the P-type MOS transistor, a cell source voltage line for giving a source voltage to the N-type MOS transistor, and a back gate voltage line for giving a back gate voltage to a back gate of the N-type MOS transistor are provided,
   the static memory in the standby state is able to be set in any of a third state and a fourth state,
   in the third state, the cell source voltage line and the back gate voltage line have voltages equal to each other and higher than a ground voltage, and
   in the fourth state, the back gate voltage line has a voltage equal to or higher than the ground voltage and lower than a voltage of the cell source voltage line.

3. The semiconductor integrated circuit device according to claim 1,
   wherein a channel leakage current of the N-type MOS transistor is lower in the second state than in the first state.

4. The semiconductor integrated circuit device according to claim 2,
   wherein a channel leakage current of the N-type MOS transistor is lower in the third state than in the fourth state.

5. The semiconductor integrated circuit device according to claim 1,
   wherein the memory cells each include:
   a leakage type determining unit which determines which one of a current component indicating a sum of a gate leakage and a substrate leakage and a current component indicating a channel leakage is larger and outputs a determination result thereof as a leakage determining signal; and
   a voltage control unit which variably controls a voltage to be supplied to the memory cell based on the leakage determining signal.

6. The semiconductor integrated circuit device according to claim 5,
   wherein the leakage type determining unit includes:
   a first leakage measurement transistor which measures leakage currents of the gate leakage and the substrate leakage;
   a second leakage measurement transistor which measures a leakage current of the channel leakage; and
   a determining unit which compares the leakage currents measured by the first leakage measurement transistor and the second leakage measurement transistor, determines which one is larger between the leakage current of the gate leakage and the substrate leakage and the leakage current of the channel leakage, and outputs the determination result thereof as the leakage determining signal.

7. The semiconductor integrated circuit device according to claim 5,
   wherein the leakage type determining unit switches the leakage determining signal depending on temperature.

8. The semiconductor integrated circuit device according to claim 7,
   wherein the leakage type determining unit includes a temperature sensor unit and a determining unit, and
   it is determined that the leakage current of the channel leakage is larger when a temperature measured by the temperature sensor unit is higher than a threshold temperature, it is determined that the leakage current of the gate leakage and the substrate leakage is larger when the temperature measured by the temperature sensor unit is lower than the threshold temperature, and the determination result is outputted as the leakage determining signal.

9. The semiconductor integrated circuit device according to claim 1,
   wherein state selection is made from outside of the static memory.

10. The semiconductor integrated circuit device according to claim 1, further comprising:
    a logic circuit formed of a central processing unit or a logic circuit capable of achieving an arbitrary function.

11. The semiconductor integrated circuit device according to claim 1, further comprising:
    a register which retains a signal given from outside of the semiconductor integrated circuit device,
    wherein the register is set at the first state or the second state by the signal.

12. The semiconductor integrated circuit device according to claim 2, further comprising:
    a register which retains a signal given from outside of the semiconductor integrated circuit device,
    wherein the register is set at the third state or the fourth state by the signal.

13. The semiconductor integrated circuit device according to claim 2,
    wherein the memory cells each include:
    a leakage type determining unit which determines which one of a current component indicating a sum of a gate leakage and a substrate leakage and a current component indicating a channel leakage is larger and outputs a determination result thereof as a leakage determining signal; and
    a voltage control unit which variably controls a voltage to be supplied to the memory cell based on the leakage determining signal.

14. The semiconductor integrated circuit device according to claim 13,
wherein the leakage type determining unit includes:
a first leakage measurement transistor which measures leakage currents of the gate leakage and the substrate leakage;
a second leakage measurement transistor which measures a leakage current of the channel leakage; and
a determining unit which compares the leakage currents measured by the first leakage measurement transistor and the second leakage measurement transistor, determines which one is larger between the leakage current of the gate leakage and the substrate leakage and the leakage current of the channel leakage, and outputs the determination result thereof as the leakage determining signal.

15. The semiconductor integrated circuit device according to claim 13,
wherein the leakage type determining unit switches the leakage determining signal depending on temperature.

16. The semiconductor integrated circuit device according to claim 15,
wherein the leakage type determining unit includes a temperature sensor unit and a determining unit, and
it is determined that the leakage current of the channel leakage is larger when a temperature measured by the temperature sensor unit is higher than a threshold temperature, it is determined that the leakage current of the gate leakage and the substrate leakage is larger when the temperature measured by the temperature sensor unit is lower than the threshold temperature, and the determination result is outputted as the leakage determining signal.

17. The semiconductor integrated circuit device according to claim 2,
wherein state selection is made from outside of the static memory.

18. The semiconductor integrated circuit device according to claim 2, further comprising:
a logic circuit formed of a central processing unit or a logic circuit capable of achieving an arbitrary function.

* * * * *